United States Patent
Kim et al.

(10) Patent No.: US 11,824,148 B2
(45) Date of Patent: Nov. 21, 2023

(54) SEMICONDUCTOR LIGHT EMITTING DEVICES AND METHOD OF MANUFACTURING THE SAME

(71) Applicant: ELPHOTON INC., Yongin-si (KR)

(72) Inventors: Kyoung Min Kim, Gyeonggi-do (KR); Bong Hwan Kim, Gyeonggi-do (KR); Jung Woo Han, Gyeonggi-do (KR)

(73) Assignee: Elphoton Inc., Gyeonggi-do (KR)

( * ) Notice: Subject to any disclaimer, the term of this patent is extended or adjusted under 35 U.S.C. 154(b) by 0 days.

(21) Appl. No.: 17/870,475

(22) Filed: Jul. 21, 2022

(65) Prior Publication Data

US 2022/0359802 A1    Nov. 10, 2022

Related U.S. Application Data

(63) Continuation of application No. 16/285,471, filed on Feb. 26, 2019, now abandoned.

(30) Foreign Application Priority Data

Feb. 26, 2018 (KR) .......................... 10-2018-0023040
Mar. 2, 2018 (KR) .......................... 10-2018-0025055
(Continued)

(51) Int. Cl.
*H01L 33/60* (2010.01)
*H01L 33/62* (2010.01)
(Continued)

(52) U.S. Cl.
CPC .............. *H01L 33/60* (2013.01); *H01L 33/40* (2013.01); *H01L 33/465* (2013.01);
(Continued)

(58) Field of Classification Search
CPC ....... H01L 33/60; H01L 33/40; H01L 33/465; H01L 33/486; H01L 33/56; H01L 33/62
See application file for complete search history.

(56) References Cited

U.S. PATENT DOCUMENTS 6,392,294 B1   5/2002  Yamaguchi
6,489,637 B1   12/2002 Sakamoto et al.
(Continued)

FOREIGN PATENT DOCUMENTS

CN        105940511 A       9/2016
DE   10 2016 110 945    *  6/2016  .............. C08L 83/04
(Continued)

OTHER PUBLICATIONS

Office Action from corresponding Chinese Patent Application No. 201910140688.6, dated Sep. 3, 2021.
(Continued)

*Primary Examiner* — Jay C Kim
(74) *Attorney, Agent, or Firm* — Harness, Dickey & Pierce, P.L.C.

(57) ABSTRACT

Disclosed is a semiconductor light emitting device including: A semiconductor light emitting device comprising: a semiconductor light emitting device chip including a plurality of semiconductor layers, and electrodes electrically connected to the plurality of semiconductor layers, the plurality of semiconductor layers including an active layer adapted to generate light by recombination of electrons and holes; an encapsulating member of a lens shape made of a light-transmitting thermoplastic resin having at least 90% transmissivity for light of a wavelength band ranging from 100 nm to 400 nm, for surrounding the semiconductor light emitting device chip; and an external substrate including conductive layers electrically connected to the electrodes of the semiconductor light emitting device chip. The encapsulating member is formed in a way that all faces of the
(Continued)

encapsulating member are exposed to outside, except for a portion of the lower face thereof in contact with the external substrate.

4 Claims, 24 Drawing Sheets

(30) Foreign Application Priority Data

| Mar. 2, 2018 | (KR) | 10-2018-0025056 |
|---|---|---|
| Mar. 2, 2018 | (KR) | 10-2018-0025057 |
| Mar. 22, 2018 | (KR) | 10-2018-0033157 |
| May 2, 2018 | (KR) | 10-2018-0050566 |
| May 2, 2018 | (KR) | 10-2018-0050568 |
| May 2, 2018 | (KR) | 10-2018-0050569 |
| May 2, 2018 | (KR) | 10-2018-0050570 |

(51) Int. Cl.
  *H01L 33/46* (2010.01)
  *H01L 33/48* (2010.01)
  *H01L 33/56* (2010.01)
  *H01L 33/40* (2010.01)

(52) U.S. Cl.
  CPC ............ *H01L 33/486* (2013.01); *H01L 33/56* (2013.01); *H01L 33/62* (2013.01)

(56) References Cited

U.S. PATENT DOCUMENTS

| 6,661,084 | B1 | 12/2003 | Peterson et al. | |
| 6,730,933 | B1* | 5/2004 | Shimizu | H01L 25/0753 257/E33.059 |
| 6,765,801 | B1 | 7/2004 | Glenn et al. | |
| 6,879,034 | B1 | 4/2005 | Yang et al. | |
| 6,949,771 | B2 | 9/2005 | Yoganandan et al. | |
| 7,262,436 | B2 | 8/2007 | Kondoh et al. | |
| 7,365,371 | B2 | 4/2008 | Andrews | |
| 7,393,706 | B2 | 7/2008 | Adachi et al. | |
| 7,473,940 | B2 | 1/2009 | Pang | |
| 7,491,980 | B2* | 2/2009 | Higaki | H01L 33/486 257/99 |
| 7,497,597 | B2 | 3/2009 | Suehiro et al. | |
| 7,521,728 | B2 | 4/2009 | Andrews | |
| 7,547,923 | B2 | 6/2009 | Shin et al. | |
| 7,646,035 | B2 | 1/2010 | Loh et al. | |
| 7,646,088 | B2 | 1/2010 | Itoh et al. | |
| 7,710,016 | B2 | 5/2010 | Miki et al. | |
| 7,714,341 | B2 | 5/2010 | Chil Keun et al. | |
| 7,802,901 | B2 | 9/2010 | McMillan | |
| 7,824,937 | B2 | 11/2010 | Suehiro et al. | |
| 7,868,341 | B2 | 1/2011 | Diana et al. | |
| 7,939,842 | B2* | 5/2011 | Loh | H01L 33/52 257/E33.059 |
| 7,964,943 | B2 | 6/2011 | Seo et al. | |
| 7,977,138 | B1 | 7/2011 | Meng et al. | |
| 8,013,351 | B2* | 9/2011 | Hsiao | H01L 33/486 257/98 |
| 8,039,863 | B2* | 10/2011 | Cho | H01L 33/58 257/E33.057 |
| 8,053,796 | B2 | 11/2011 | Wang et al. | |
| 8,168,998 | B2 | 5/2012 | David et al. | |
| 8,203,214 | B2 | 6/2012 | Bathan et al. | |
| 8,445,927 | B2 | 5/2013 | Joo et al. | |
| 8,501,509 | B2 | 8/2013 | Mondada et al. | |
| 8,530,918 | B2 | 9/2013 | Jang | |
| 8,541,800 | B2 | 9/2013 | Joo et al. | |
| 8,552,453 | B2 | 10/2013 | Takine | |
| 8,592,836 | B2* | 11/2013 | Yokotani | H01L 33/62 438/22 |
| 8,685,766 | B2 | 4/2014 | Suehiro et al. | |
| 8,697,458 | B2 | 4/2014 | Nolan et al. | |
| 8,729,586 | B2 | 5/2014 | Wu et al. | |
| 8,735,920 | B2* | 5/2014 | Ibbetson | H01L 33/486 257/E33.068 |
| 8,735,928 | B2 | 5/2014 | Jager et al. | |
| 8,757,826 | B2* | 6/2014 | Sakai | H01L 33/505 362/249.02 |
| 8,757,833 | B2* | 6/2014 | You | H01L 33/486 362/235 |
| 8,835,957 | B2 | 9/2014 | Beppu et al. | |
| 8,878,215 | B2 | 11/2014 | Park et al. | |
| 8,882,304 | B2 | 11/2014 | Wu et al. | |
| 8,882,313 | B2 | 11/2014 | Lin et al. | |
| 8,957,435 | B2 | 2/2015 | Emerson et al. | |
| 8,963,188 | B2* | 2/2015 | Park | H01L 33/54 257/667 |
| 8,967,827 | B2 | 3/2015 | Urano et al. | |
| 8,969,908 | B2 | 3/2015 | Negley et al. | |
| 8,981,407 | B2 | 3/2015 | Chang et al. | |
| 9,048,393 | B2 | 6/2015 | Zitzlsperger et al. | |
| 9,053,958 | B2 | 6/2015 | Donofrio et al. | |
| 9,059,382 | B2* | 6/2015 | Yamamoto | H01L 33/62 |
| 9,070,850 | B2 | 6/2015 | Keller | H01L 33/486 |
| 9,097,822 | B2* | 8/2015 | Fujishiro | G02B 3/0012 |
| 9,121,555 | B2 | 9/2015 | Hwang et al. | |
| 9,130,137 | B2 | 9/2015 | Lin et al. | |
| 9,202,999 | B2* | 12/2015 | Kawano | H01L 33/58 |
| 9,231,166 | B2 | 1/2016 | Lee et al. | |
| 9,252,336 | B2 | 2/2016 | Shi et al. | |
| 9,362,472 | B2 | 6/2016 | Lin | |
| 9,414,454 | B2 | 8/2016 | Brandes et al. | |
| 9,653,661 | B2 | 5/2017 | Suehiro et al. | |
| 9,660,161 | B2 | 5/2017 | Andrews | |
| 9,666,772 | B2* | 5/2017 | Ibbetson | H01L 33/54 |
| 9,673,363 | B2 | 6/2017 | Donofrio et al. | |
| 9,691,949 | B2* | 6/2017 | Reiherzer | H01L 24/97 |
| 9,755,120 | B2* | 9/2017 | Thompson | H01L 33/54 |
| 9,831,409 | B2 | 11/2017 | Yoon | |
| 9,857,049 | B2 | 1/2018 | Chung et al. | |
| 9,972,756 | B2 | 5/2018 | Yoshikawa et al. | |
| 10,028,411 | B2 | 7/2018 | Polak et al. | |
| 10,090,446 | B2* | 10/2018 | Kuramoto | H01L 33/52 |
| 10,103,304 | B2 | 10/2018 | Kobayakawa | |
| 10,147,853 | B2 | 12/2018 | Keller et al. | |
| 10,186,643 | B2 | 1/2019 | Kang | |
| 10,290,777 | B2 | 5/2019 | Andrews et al. | |
| 10,381,525 | B2 | 8/2019 | Beppu | |
| 10,403,797 | B2* | 9/2019 | Yamamoto | H01L 33/50 |
| 10,408,420 | B2 | 9/2019 | Kamada | |
| 10,446,391 | B2 | 10/2019 | Grandusky et al. | |
| 10,685,939 | B2 | 6/2020 | You et al. | |
| 11,114,594 | B2 | 9/2021 | Chakraborty | |
| 11,574,949 | B2* | 2/2023 | Matsugai | G03B 17/02 |
| 2004/0097006 | A1 | 5/2004 | Lowery | |
| 2005/0151142 | A1 | 7/2005 | Imai | |
| 2006/0138443 | A1 | 6/2006 | Fan et al. | |
| 2006/0171152 | A1 | 8/2006 | Suehiro et al. | |
| 2006/0261364 | A1 | 11/2006 | Suehiro et al. | |
| 2007/0023769 | A1* | 2/2007 | Nishimoto | H01L 33/641 257/88 |
| 2007/0029569 | A1 | 2/2007 | Andrews | |
| 2008/0029775 | A1 | 2/2008 | Liu et al. | |
| 2012/0097985 | A1 | 4/2012 | Liu et al. | |
| 2014/0124812 | A1* | 5/2014 | Kuramoto | H01L 24/97 438/27 |
| 2014/0217459 | A1* | 8/2014 | Nakayama | H01L 25/167 428/156 |
| 2019/0267525 | A1 | 8/2019 | Kim et al. | |
| 2020/0185581 | A1* | 6/2020 | Liu | H01L 33/0095 |

FOREIGN PATENT DOCUMENTS

| JP | 4686132 B2 | 5/2011 |
| JP | 2012-033855 A | 2/2012 |
| JP | 2013-008941 A | 1/2013 |
| JP | 2013-048264 A | 3/2013 |
| JP | 2016-006832 A | 1/2016 |
| KR | 10-2008-0033496 A | 4/2008 |

(56) References Cited

FOREIGN PATENT DOCUMENTS

| KR | 10-2010-0071937 A | 6/2010 |
| KR | 10-1226282 B1 | 1/2013 |
| KR | 10-2014-0127457 A | 11/2014 |

OTHER PUBLICATIONS

Office Action (Non-Final) from corresponding U.S. Appl. No. 16/285,471, dated May 5, 2020.
Office Action (Final) from corresponding U.S. Appl. No. 16/285,471, dated Jan. 11, 2021.
Office Action (Non-Final) from corresponding U.S. Appl. No. 16/285,471, dated Jul. 21, 2021.
Office Action (Final) from corresponding U.S. Appl. No. 16/285,471, dated Feb. 1, 2022.

* cited by examiner (b)

| ΔPo | 159% | 154% | 140% |
|---|---|---|---|
| Size of conductive layer (Φ) | 1.7mm | 2.2mm | 3.0mm |
| Size of barrier (Φ) | 2.1mm | 2.6mm | 3.4mm |
| Size of encapsulating member lower face (Φ) | 2.1mm | 2.6mm | 3.4mm |
| Area of conductive layer / Area of chip (%) | 45% | 68% | 83% |
| Remarks |  |  |  |

| ΔPo | 164% | 161% | 153% |
|---|---|---|---|
| Size of conductive layer (Φ) | 1.7mm | 2.2mm | 3.0mm |
| Size of barrier (Φ) | 2.1mm | 2.6mm | 3.4mm |
| Size of encapsulating member lower face (Φ) | 2.1mm | 2.6mm | 3.4mm |
| Area of conductive layer/Area of chip (%) | 43% | 68% | 83% |
| Remarks |  |  |  |

(a)

(b)

(a)

(b)

| Area of conductive layer and area of semiconductor light emitting device chip (unit: mm2) |||||
|---|---|---|---|---|
| Classification | Total area of conductive layer | Area of semiconductor light emitting device chip | Exposed area of conductive layer | Area ratio (Exposed area of conductive layer/Total area of conductive layer) |
| Large-area chip | 2.0998 | 1.1532 | 0.9466 | 45% |
| | | 1.32 | 0.7798 | 37% |
| Small-area chip | 0.7054 | 0.105 | 0.6004 | 85% |
| | | 0.21 | 0.4954 | 70% |
FIG. 10
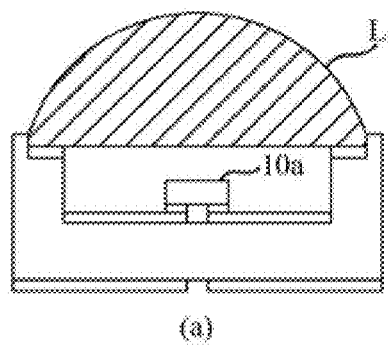
(a)
FIG. 11A
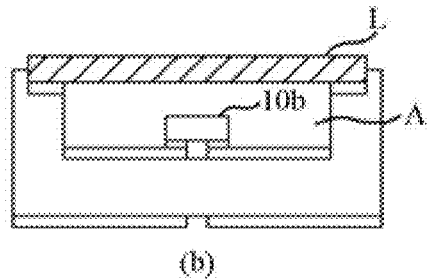
(b)
FIG. 11B (a)

(b)

(c)

(h)

(i)

(j)

(a)

(b)

SEMICONDUCTOR LIGHT EMITTING DEVICES AND METHOD OF MANUFACTURING THE SAME

CROSS-REFERENCE TO RELATED APPLICATIONS

This application is a continuation application of U.S. application Ser. No. 16/285,471, filed on Feb. 26, 2019, which claims the benefit of and priority to Korean Patent Application No. 10-2018-0023040, filed on Feb. 26, 2018, Korean Patent Application No. 10-2018-0025057, filed on Mar. 2, 2018, Korean Patent Application No. 10-2018-0025056, filed on Mar. 2, 2018, Korean Patent Application No. 10-2018-0025055, filed on Mar. 2, 2018, Korean Patent Application No. 10-2018-0033157, filed on Mar. 22, 2018, Korean Patent Application No. 10-2018-0050570, filed on May 2, 2018, Korean Patent Application No. 10-2018-0050569, filed on May 2, 2018, Korean Patent Application No. 10-2018-0050568, filed on May 2, 2018 and Korean Patent Application No. 10-2018-0050566, filed on May 2, 2018. The entire disclosure of the above applications is incorporated herein by reference.

FIELD

The present disclosure relates generally to semiconductor light emitting devices and, more particularly, to a semiconductor light emitting device with an increased light extraction efficiency.

BACKGROUND

This section provides background information related to the present disclosure which is not necessarily prior art.

FIG. 1 illustrates an example of semiconductor light emitting device chips in the prior art.

The semiconductor light emitting device chip includes a growth substrate 610 (e.g. a sapphire substrate), a plurality of layers deposited in sequence over the growth substrate 610, including a buffer layer 620, a first semiconductor layer 630 having a first conductivity (e.g., an n-type GaN layer), an active layer 640 adapted to generate light by electron-hole recombination (e.g., INGaN/(In)GaN MQWs) and a second semiconductor layer 650 having a second conductivity different from the first conductivity (e.g., a p-type GaN layer), followed by a light-transmitting conductive layer 660 for current spreading, an electrode 670 serving as a bonding pad, and an electrode 680 (e.g., a Cr/Ni/Au stacked metallic pad) serving as a bonding pad formed on an etch-exposed portion of the first semiconductor layer 630. This particular type of the semiconductor light emitting device chip shown in FIG. 1 is called a lateral chip. Here, one side of the growth substrate 610 serves as a mounting face during electrical connections to outside. In the context herein, the term "outside" to which a semiconductor light emitting device chip or a semiconductor light emitting device is electrically connected denotes a PCB (Printed Circuit Board), a submount, a TFT (Thin Film Transistor) or the like.

FIG. 2 shows an example of a semiconductor light emitting device chip disclosed in U.S. Pat. No. 7,262,436. For convenience of description, different reference numerals are used for some components.

The semiconductor light emitting device chip includes a growth substrate 610, a plurality of layers deposited in sequence over the growth substrate 610, including a first semiconductor layer 630 having a first conductivity, an active layer 640 adapted to generate light by electron-hole recombination and a second semiconductor layer 650 having a second conductivity different from the first conductivity, followed by a three-layered electrode 690, 691 and 692 adapted to reflect light towards the growth substrate 610, in which the three-layered electrode includes a first electrode layer 690 that can be a reflective Ag layer, a second electrode layer 691 that can be a Ni diffusion barrier, and a third electrode layer 692 that can be an Au bonding layer. Next, an electrode 680 serving as a bonding pad is formed on an etch-exposed portion of the first semiconductor layer 630. Here, one side of the electrode layer 692 serves as a mounting face during electrical connections to outside. This particular type of the semiconductor light emitting device chip as in FIG. 2 is called a flip chip. In this flip chip, the electrode 680 formed on the first semiconductor layer 630 is placed at a lower height level than the electrode layers 690, 691 and 692 formed on the second semiconductor layer in the case of the flip chip shown in FIG. 2, but alternatively it may be formed at the same height level as the electrode layers. Here, height levels are given with respect to the growth substrate 610.

FIG. 3 shows an example of a semiconductor light emitting device 700 in the prior art.

The semiconductor light emitting device 700 is provided with lead frames 710 and 720, a mold 730, and a vertical type light-emitting device chip 750 in a cavity 740 filled with an encapsulating member 770 that contains a wavelength converting material 160. The lower face of the vertical type light-emitting device chip 750 is directly electrically connected to the lead frame 710, and the upper face thereof is electrically connected to the lead frame 720 by a wire 780. A portion of the light coming out of the vertical type light-emitting device chip 750 excites the wavelength converting material 760 such that lights of different colors are generated, and white light is produced by mixing two different lights. For instance, the semiconductor light emitting device chip 750 generates blue light, and the wavelength converting material 760 is excited to generate yellow light. Then these blue and yellow lights can be mixed to produce white light. While the semiconductor light emitting device shown in FIG. 3 is produced using the vertical type light emitting device chip 750, other types of semiconductor light emitting devices similar to the one in FIG. 3 may also be produced using the semiconductor light emitting device chips illustrated in FIG. 1 and FIG. 2.

In general, such a semiconductor light emitting device described in FIG. 3 is referred to as a package type semiconductor light emitting device, and a semiconductor light emitting device with the size of a chip is referred to as a CSP (Chip Scale Package) type semiconductor light emitting device. Description relevant to CSP type semiconductor light emitting devices can be found in Korean Patent Laid-Open Publication No. 10-2014-0127457. To keep abreast with high demands for a smaller size semiconductor light emitting device, more researches on CSP type semiconductor light emitting devices are actively in progress.

SUMMARY

This section provides a general summary of the present disclosure and is not a comprehensive disclosure of its full scope or all of its features.

According to one aspect of the present disclosure, there is provided a semiconductor light emitting device including: a semiconductor light emitting device chip which includes a plurality of semiconductor layers, and electrodes electrically connected to the plurality of semiconductor layers, the plurality of semiconductor layers including an active layer adapted to generate ultraviolet light by recombination of electrons and holes; an encapsulating member adapted to surround the semiconductor light emitting device chip; and an external substrate including a base, and conductive layers electrically connected to the electrodes of the semiconductor light emitting device chip, wherein a flat area portion of the external substrate that is in contact with a lower face of the encapsulating member is smaller than a flat area portion of the external substrate that is not in contact with the lower face of the encapsulating member.

According to another aspect of the present disclosure, there is provide a method of manufacturing a preliminary encapsulating member for use in a semiconductor light emitting device including a semiconductor light emitting device chip, the method including: placing dummy semiconductor light emitting device chips on a first base layer; forming a preliminary encapsulating member substrate on a second base layer; placing the dummy semiconductor light emitting device chips to face the preliminary encapsulating member substrate arranged on the second base layer; compressing the preliminary encapsulating member substrate by the dummy semiconductor light emitting device chips to form a preliminary encapsulating member with a plurality of grooves; and scribing the substrate along a scribe line to separate and obtain individual preliminary encapsulating members.

According to another aspect of the present disclosure, there is provided a method of manufacturing semiconductor light emitting devices, the method including: preparing an external substrate having conductive layers; placing, over the external substrate, a semiconductor light emitting device chip which includes a plurality of semiconductor layers and electrodes electrically connected to the plurality of semiconductor layers, the plurality of semiconductor layers including an active layer adapted to generate light by recombination of electrons and holes, in such a way that the conductive layers of the external substrate are electrically connected to the electrodes of the semiconductor light emitting device chip; arranging an preliminary encapsulating member made of a light-transmitting thermoplastic resin over the semiconductor light emitting device chip; and heat-curing the preliminary encapsulating member to form an encapsulating member that surrounds the semiconductor light emitting device chip.

According to another aspect of the present disclosure, there is provided a semiconductor light emitting device including: a semiconductor light emitting device chip including a plurality of semiconductor layers, and electrodes electrically connected to the plurality of semiconductor layers, the plurality of semiconductor layers including an active layer adapted to generate light by recombination of electrons and holes; an encapsulating member of a lens shape made of a light-transmitting thermoplastic resin having at least 90% transmissivity for light of a wavelength band ranging from 100 nm to 400 nm, for surrounding the semiconductor light emitting device chip; and an external substrate including conductive layers electrically connected to the electrodes of the semiconductor light emitting device chip, wherein the encapsulating member is formed in a way that all faces of the encapsulating member are exposed to outside, except for a portion of the lower face thereof in contact with the external substrate.

According to another aspect of the present disclosure, there is provided a semiconductor light emitting device comprising: a semiconductor light emitting device chip which includes a plurality of semiconductor layers, and electrodes electrically connected to the plurality of semiconductor layers, the plurality of semiconductor layers including an active layer adapted to generate ultraviolet light by recombination of electrons and holes; an encapsulating member adapted to surround the semiconductor light emitting device chip; and an external substrate including a base made of an insulating substance, a barrier, and conductive layers electrically connected to the electrodes of the semiconductor light emitting device chip, wherein an upper face of the barrier is in contact with a lower face of the encapsulating member.

According to another aspect of the present disclosure, there is provided a method of manufacturing semiconductor light emitting devices, the method including: preparing a base made of an insulating substance; forming a conductive layer and a barrier on one face of the base, the barrier being placed at a predefined distance from the conductive layer and protruded in a closed loop form from an upper face of the base; electrically connecting electrodes of a semiconductor light emitting device chip to the conductive layer; and forming an encapsulating member for surrounding the semiconductor light emitting device chip, the encapsulating member being adapted to entirely cover the upper face of the barrier, except for an outer lateral face of the same.

According to another aspect of the present disclosure, there is provided a semiconductor light emitting device including: a semiconductor light emitting device chip which includes a plurality of semiconductor layers, and electrodes electrically connected to the plurality of semiconductor layers, the plurality of semiconductor layers including an active layer adapted to generate ultraviolet light by recombination of electrons and holes; an encapsulating member adapted to surround the semiconductor light emitting device chip; and an external substrate including a base, and conductive layers electrically connected to the electrodes of the semiconductor light emitting device chip, wherein if the semiconductor light emitting device chip has a flat area between 0.8 mm$^2$ and 1.5 mm$^2$, a ratio of a total area of the conductive layer to an exposed area of the conductive layer is 45% or less, and if the semiconductor light emitting device chip has a flat area between 0.06 mm$^2$ and 0.3 mm$^2$, a ratio of a total area of the conductive layer to an exposed area of the conductive layer is 85% or less.

According to another aspect of the present disclosure, there is provided a semiconductor light emitting device including: a semiconductor light emitting device chip which includes a plurality of semiconductor layers, and electrodes electrically connected to the plurality of semiconductor layers, the plurality of semiconductor layers including an active layer adapted to generate ultraviolet light by recombination of electrons and holes; an encapsulating member adapted to surround the semiconductor light emitting device chip; and an external substrate including a base, and conductive layers electrically connected to the electrodes of the semiconductor light emitting device chip, wherein one face of the conductive layer placed inside of the encapsulating member and adapted to reflect ultraviolet light is made of a substance having less than 90% reflectivity for ultraviolet light, and wherein diameter of a lower face of the encapsulating member is smaller than diameter of the same when a difference in $\Delta P_o$ value between the conductive layer made of a substance having less than 90% reflectivity for ultraviolet light and a conductive layer made of a substance having at least 90% reflectivity for ultraviolet light falls within 5%.

According to another aspect of the present disclosure, there is provided a semiconductor light emitting device including: a semiconductor light emitting device chip which includes a plurality of semiconductor layers, and electrodes electrically connected to the plurality of semiconductor layers, the plurality of semiconductor layers including an active layer adapted to generate ultraviolet light by recombination of electrons and holes; an encapsulating member adapted to surround the semiconductor light emitting device chip; and an external substrate including a base, and conductive layers electrically connected to the electrodes of the semiconductor light emitting device chip, wherein an exposed area of the conductive layer not being covered with the semiconductor light emitting device chip is no larger than 1 mm$^2$ out of a total area of the conductive layer.

BRIEF DESCRIPTION OF THE DRAWINGS

FIGS. 5, 6, 7, 8A, 8B, 9A, 9B and FIG. 10 describe characteristics of a semiconductor light emitting device according to the present disclosure in relation to diameter of an encapsulating member used.

FIGS. 11A and 11B shows a conventional semiconductor light emitting device, which is taken as a comparison for explaining merits of a semiconductor light emitting device according to the present disclosure.

DETAILED DESCRIPTION

The present disclosure will now be described in detail with reference to the accompanying drawing(s). It should be noted that the directional terms including upper/lower faces, above/below, and longitudinal/transverse directions are intended to be interpreted with respect to a given drawing. The detailed description herein is presented for purposes of illustration only and not of limitation.

Figure 1:
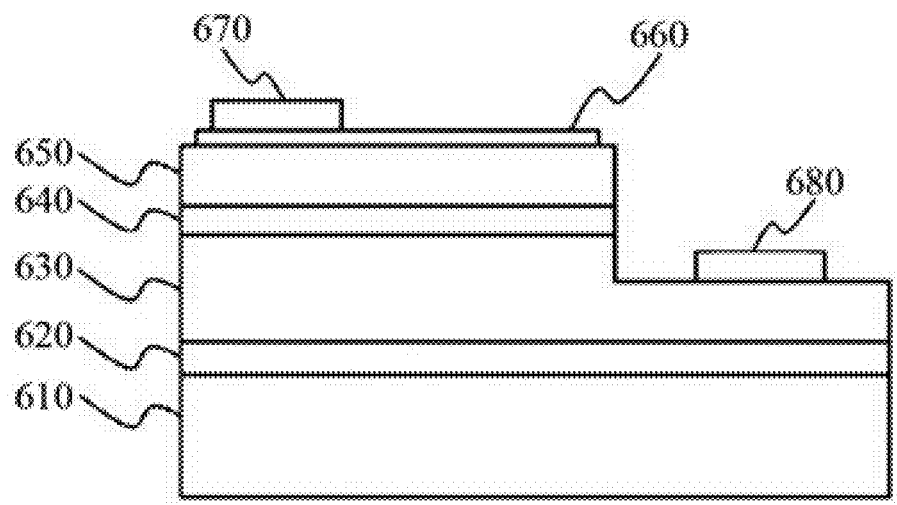
FIG. 1 shows an example of a semiconductor light emitting device chip in the prior art.
Figure 2:
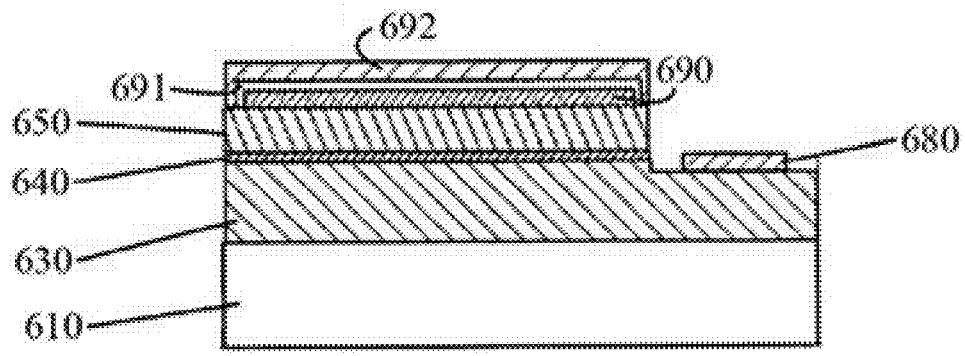
FIG. 2 shows an example of a semiconductor light emitting device chip disclosed in U.S. Pat. No. 7,262,436.
Figure 3:
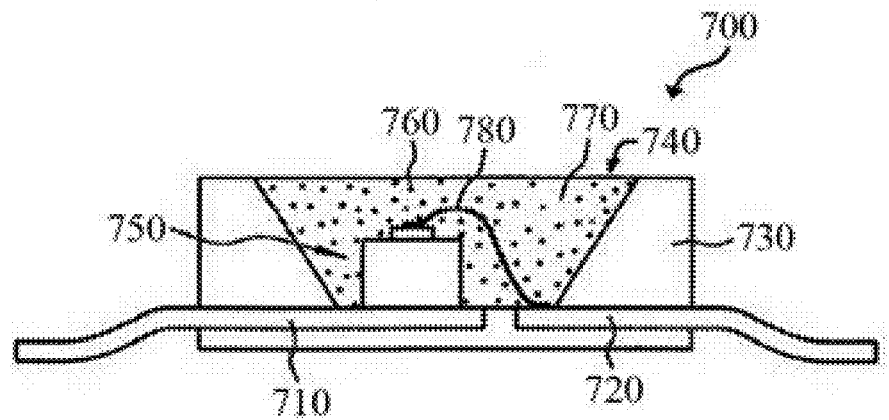
FIG. 3 shows an example of a semiconductor light emitting device in the prior art.
Figure 4A:
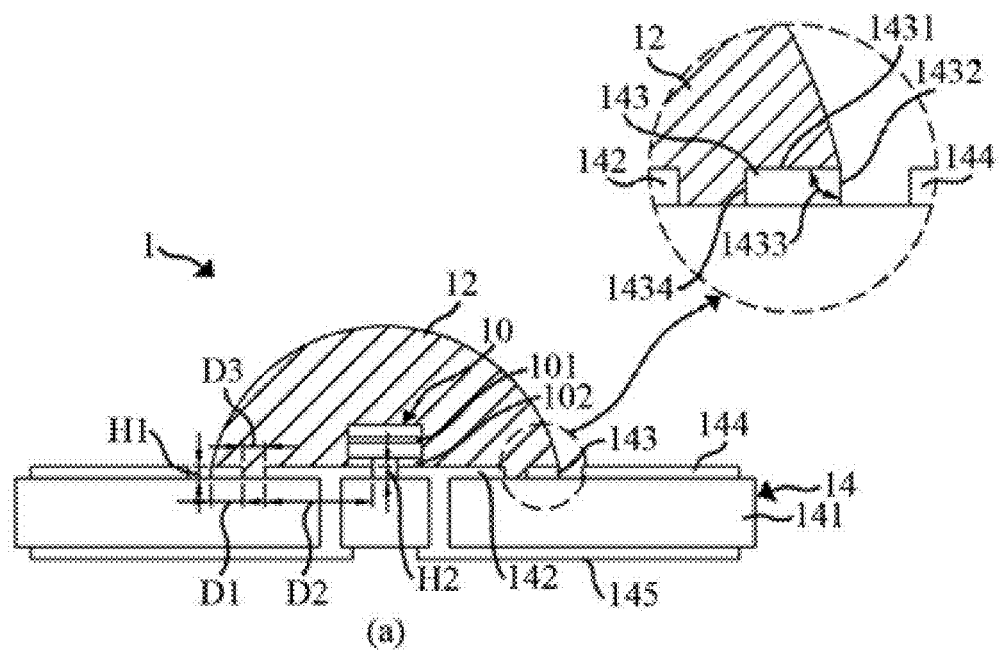
FIGS. 4A and 4B shows an example of a semiconductor light emitting device according to one aspect of the present disclosure.
Figure 4B:
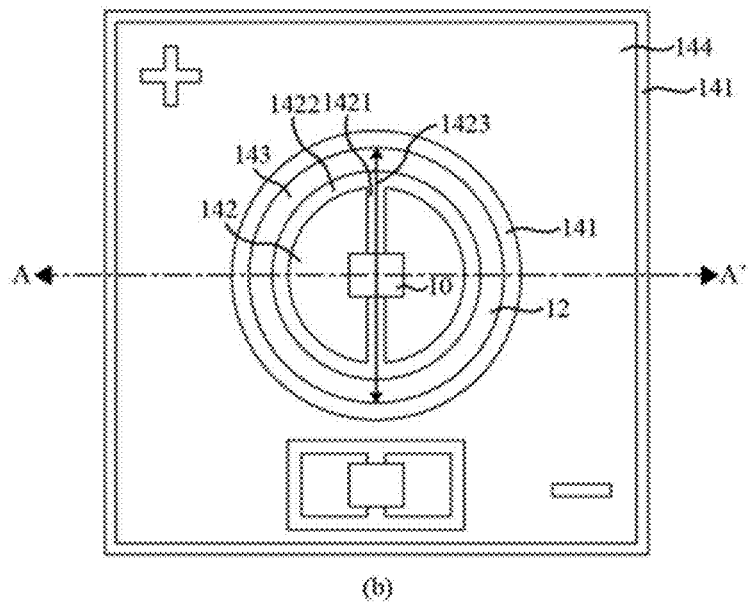

FIG. 4 shows an example of a semiconductor light emitting device 1 according to one aspect of the present disclosure, in which FIG. 4(A) is a cross sectional view taken along AA', and FIG. 4(B) is a top view.

The semiconductor light emitting device 1 includes a semiconductor light emitting device chip 10, an encapsulating member 12, and an external substrate 14.

The semiconductor light emitting device chip 10 has a plurality of semiconductor layers including an active layer 101 adapted to generate light by recombination of electrons and holes, and electrodes 102 electrically connected to the plurality of semiconductor layers. This semiconductor light emitting device chip 10 is preferably a flip chip, in which the electrode 102 is exposed from the encapsulating member 12. While the semiconductor light emitting device chip 10 in this embodiment is a flip chip, it may be, without limitation, a lateral chip or vertical chip. The active layer 101 is also shown in a magnified view for clearer description. In reality, the active layer 101 is as thin as several µm.

The encapsulating member 12 is formed over the external substrate 14 to surround the semiconductor light emitting device chip 10. An exemplary material for the encapsulating member 12 is a light-transmitting thermoplastic resin. The lower face of the encapsulating member 12 has a maximum diameter of 4 mm. It is desirable that the light-transmitting thermoplastic resin has at least 80% transmissivity for ultraviolet light (e.g. light with a wavelength band ranging from 100 nm to 400 nm). It is more desirable that the light-transmitting thermoplastic resin has at least 90% transmissivity for ultraviolet light.

The semiconductor light emitting device chip 10 in this embodiment can emit ultraviolet light. Preferably, it emits UV-C rays with wavelengths ranging from 200 nm to 280 nm. Therefore, the encapsulating member 12 made of a light-transmitting thermoplastic resin having at least 80% UV transmissivity serves as a lens and facilitates distribution of light generated from the semiconductor light emitting device chip 10, which in turn leads to an increased light extraction efficiency.

Among light-transmitting thermoplastic resins having at least 80% UV transmissivity, those thermoplastic resins which are more resistant to damage after long term overexposure to UV radiation are preferred.

The external substrate 14 is not particularly limited as far as it provides a mounting area for the semiconductor light emitting device chip 10. The external substrate 14 can be a substrate used for forming a semiconductor light emitting device. For example, it can be a substrate including reed electrodes, a printed circuit board, or metallic plate substrate.

The external substrate 14 can include a base 141, conductive layers 142 and 145, a barrier 143, and a reflective layer 144.

The base 141 can include an insulating material. Also, it can include a substance with high heat conductivity. For instance, the base 141 can include highly heat conductive polymer substance and/or ceramic substance. In particular, the base 141 can be made of AlN ceramic. In this way, when a light emitting device is in operation, the heat generated in the semiconductor light emitting device chip 10 can be effectively discharged to outside through the base 141

The conductive layers 142 and 145 are formed on an upper and a lower face of the base 141, respectively. The conductive layer 142 formed on the upper face is electrically connected to the electrode 102 of the semiconductor light emitting device chip 10. The conductive layer 142 formed on the upper face is electrically connected with the conductive layer 145 formed on the lower face, and the semiconductor light emitting device 1 is electrically connected to outside through the conductive layer 145 formed on the lower face of the base 141. The conductive layers 142 and 145 each can include an electrically conducting substance, such as a metal. Examples of the metal may include Ni, Pt, Pd, Rh, W, Ti, Al, Ag, Au, and Cu. Moreover, the conductive layers 142 and 145 each may be formed into a single layer or multiple layers. As the electrode 102 of the semiconductor light emitting device chip 10 needs to be electrically connected to the conductive layer 142 of the external substrate 14, it is preferably arranged facing towards the external substrate 14.

The barrier 143 is placed at a predefined distance away from the conductive layer 142 on the upper face of the base 141. It can be made of a metal such as Ni, Pt, Pd, Rh, W, Ti, Al, Ag, Au, or Cu. As the barrier 143, which is made of a metal, is placed at a certain distance from the conductive layer 142, any contact between them is avoided, thus lowering the risk of an electrical short.

The barrier 143 can be used as a stopper wall, i.e. a dam, for keeping the encapsulating member 12 from running over the barrier 143 when the encapsulating member 12 is formed. Alternatively, the barrier 143 can be omitted. The barrier 143 is preferably made of a material, which not only is sufficiently firm or hard to maintain the shape of the encapsulating member 12 protecting the semiconductor light emitting device chip 10, but which is also effective for avoiding cracks or splits.

Alternatively, the barrier 143 can be made of a colored reflective substance that reflects light from the semiconductor light emitting device chip 10 towards the encapsulating member 12, but it is not limited thereto.

Moreover, the barrier 143 can be made of a material (e.g., a metallic substance) other than a silicon-based material. In particular, when a metallic substance is used for forming the barrier 143, bonding strength to the external substrate 14 and to the encapsulating member 12 is enhanced, which in turn improves the reliability of a semiconductor light emitting device. Additionally, when a metallic substance is used, the barrier 143 can be formed at the same time with the conductive layer 142 which is also made of a metallic substance. As a result, the overall manufacturing process is shortened, and an amount of time and cost for manufacturing can be reduced accordingly.

Although the barrier 143 serves as a dam, it does not mean that it serves as a wall that stops the overflow of a light-transmitting thermoplastic resin of the encapsulating member 12. Rather, the encapsulating member 12 does not run over the barrier 143 because of surface tension created between the upper face of the barrier 143 and the lower face of the encapsulating member 12 when the encapsulating member 12 is formed. Thus, the encapsulating member 12 can be adapted to cover all or only a part of the upper face of the barrier 143. Because the effects of surface tension that are created between the encapsulating member 12 and an upper face 1431 of the barrier 143 are maximized on a corner where the upper face 1431 of the barrier 143 meets an outer lateral face 1432 of the barrier 143 facing the reflective layer 144, among all those corners where the upper face 1431 meets lateral faces of the barrier 143, it is desirable that the upper face 1431 of the barrier 143 is entirely covered with the encapsulating member 12. Particularly, when the upper face 1431 of the barrier 143 is at right angles to the outer lateral face 1432 of the barrier 143, the surface tension effects that are created between the encapsulating member 12 and the upper face 1431 of the barrier 143 are maximized. In addition, to prevent the encapsulating member 12 from running over, the barrier 143 preferably has a closed loop form without a slit. The surface tension that is generated between the barrier 143 and the encapsulating member 12 is maximized if the barrier 143 is made of a metallic substance. In this case, the encapsulating member 12 can readily form a lens shape. However, if the barrier 143 is made of a metallic substance, and along with that, if the barrier 143 has a closed loop shape, it is preferable to have the base 141 made of an insulating material to avoid an electrical short. For better understanding, the upper and outer lateral faces 1431 and 1432 of the barrier 143 are shown in a magnified dotted circle. Here, an inner lateral face 1434 of the barrier 143 may be covered with the encapsulating member 12, while the outer lateral face 1432 of the barrier 143 may not be covered with the encapsulating member 12. In this disclosure, a diameter of the lower face of the encapsulating member 12 is crucial, and the reason behind it will be explained later with reference to FIG. 5. The barrier 143 is an essential component as it controls the diameter of the lower face of the encapsulating member 12. The present disclosure also includes an alternative where the barrier 143 serves as a blocking wall.

Preferably, the barrier 143 has a height H1 less than a height of the semiconductor light emitting device chip 10 and equal to a height H2 of the conductive layer 142, but it is not limited thereto. For instance, the height H1 of the barrier 143 may be less or greater than the height H2 of the conductive layer 142. A view angle of light coming out of the semiconductor light emitting device 1 in the case where the height of the barrier 143 is not greater the height of the conductive layer 142 is broader than that of the case where the height of the barrier 143 is greater than the height of the conductive layer 142.

Preferably, the barrier 143 has a width D1 less than a width D2 of the conductive layer 142, and less than a separating gap D3 between the barrier 143 and the conductive layer 142, but it is not limited thereto. Alternatively, the width D1 of the barrier 143 may be equal to or greater than the separating gap D3 between the barrier 143 and the conductive layer 142.

The reflective layer 144 is formed on the upper face of the base 141, and may be made of a reflecting substance, for example, a metallic substance including Al, Ag or Au. When the conductive layer 142, the barrier 143 and the reflective layer 144 are all made of the same substance (e.g. Au), these three layers can be formed at one time, and the manufacturing process is therefore simplified. Forming a metal layer on the base 141 can be done by deposition or plating. Preferably though, the inside of the conductive layer 142 is partially made of Al. Here, the reflective layer 144 is placed at a predefined distance from the semiconductor light emitting device chip 10 and from the barrier 143, such that a difference in thermal expansion coefficient between the reflective layer 144 and the encapsulating member 12 can be overcome, or an electrical short between the semiconductor light emitting device chip 10 and the reflective layer 144 can be avoided.

The light coming out of the semiconductor light emitting device chip 10 facing the external substrate 14 is reflected by the reflective layer 144 and then goes upwardly toward the upper side of the external substrate 14. This in turn can increase light extraction efficiency in a semiconductor light emitting device. In particular, if the light coming out of the semiconductor light emitting device chip 10 is ultraviolet right, it is preferable to make the reflective layer 144 of Al having a high reflection efficiency.

Figure 18A:
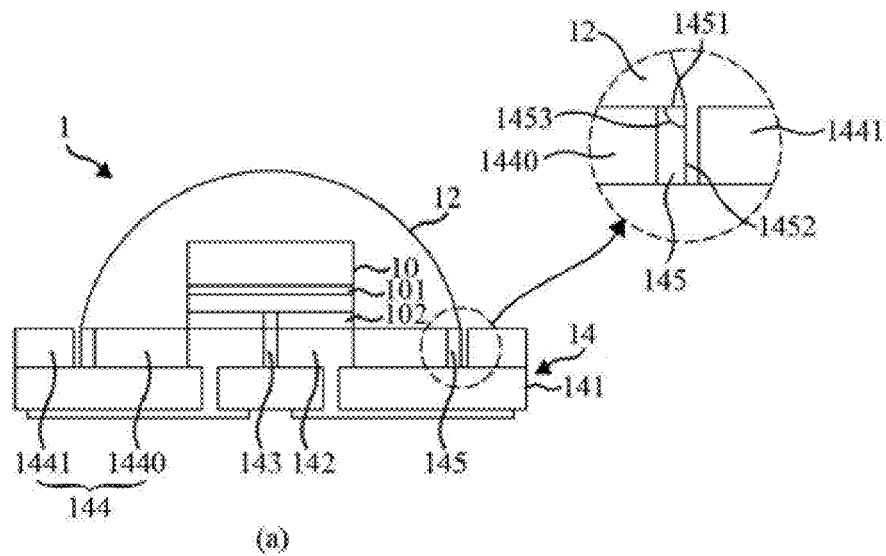
FIGS. 18A and 18B shows an example of a semiconductor light emitting device according to one aspect of the present disclosure.
Figure 18B:
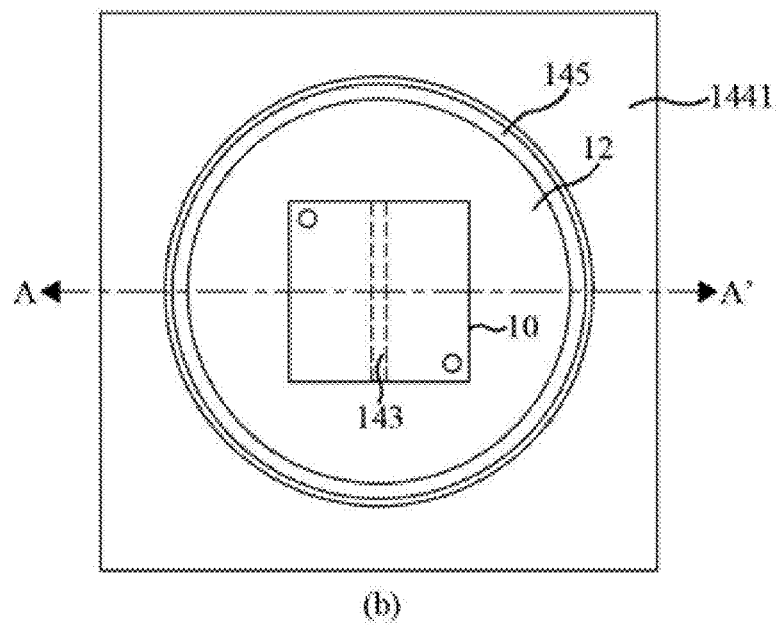
Figure 19:
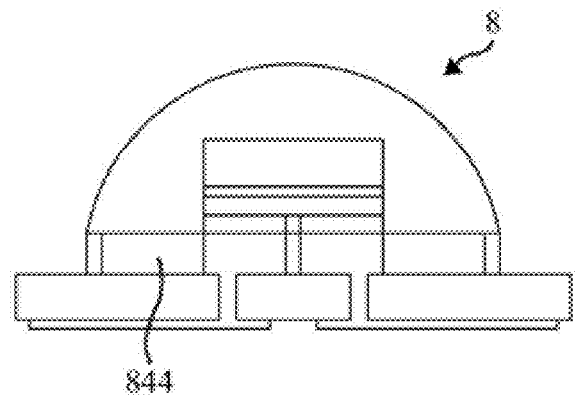
FIG. 19 shows an example of a semiconductor light emitting device according to one aspect of the present disclosure.

The reflective layer 144 can be formed between the conductive layer 142 and the barrier 143 (see FIG. 18), or it can only be formed between the conductive layer 142 and the barrier 143 (see FIG. 19). The reflective layer 144 may not be formed at all (see FIG. 20).

The external substrate 14 can further include a heat emission pad (not shown) on the lower face of the base 141. The heat emission pad facilitates heat emission from the external substrate 14 to outside.

FIG. 5 to FIG. 10 describe characteristics of a semiconductor light emitting device 1 according to the present disclosure in relation to diameter of an encapsulating member used.

Figure 5:
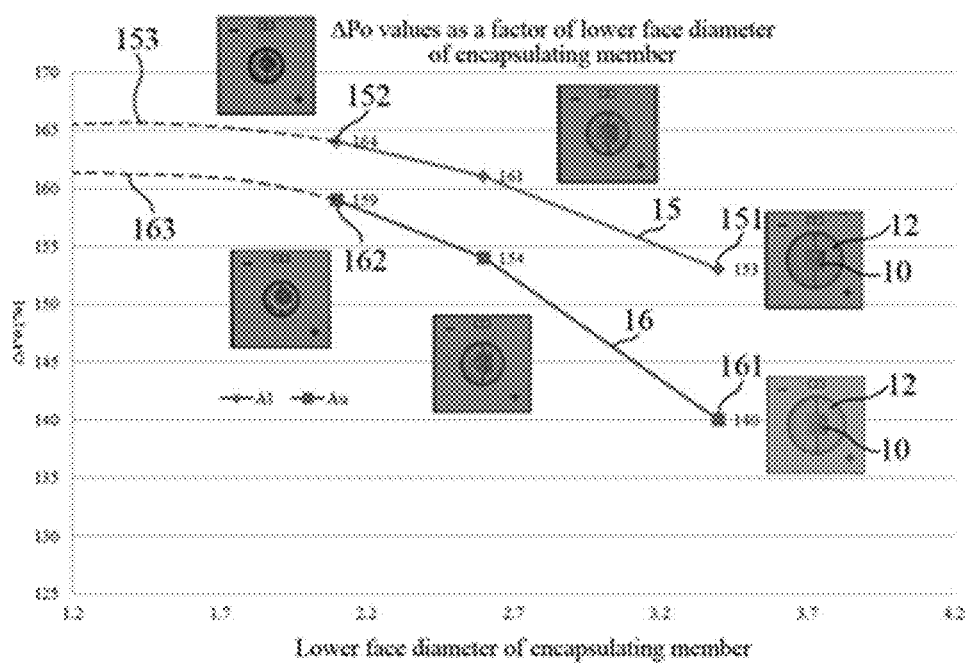

In the semiconductor light emitting device 1, the encapsulating member 12 has a flat area with a dimension equal to or smaller than a flat area of a portion surrounded by the closed loop shape barrier 143. As described in FIG. 4, the reason for the greatest surface tension between the encapsulating member 12 and the barrier 143 is because the lower face of the encapsulating member 12 covers all of the upper face of the barrier 143. Therefore, the flat area of the encapsulating member 12 preferably has a dimension equivalent to the flat area of the portion surrounded by the barrier 143. For example, the flat surface of the encapsulating member 12 and the flat surface of the portion surrounded by the barrier 143 are circular as shown in FIG. 4, diameter 1431 of the lower face of the encapsulating member 12 has the same size as diameter 1431 of the barrier 143. FIG. 5 describe experimental results obtained by the inventors, showing that a $\Delta P_o$ value is increased as diameter of the lower face of the encapsulating member 12 that surrounds the semiconductor Ultraviolet light emitting device chip gets smaller. An intensity of light loss due to internal reflection of the encapsulating member 12 is reduced as the diameter of the lower face of the encapsulating member 12 decreases, and this is why the $\Delta P_o$ value is increased. The semiconductor light emitting device chip 10, the conductive layer 142 and the barrier 143 are the ones that are arranged inside of the encapsulating member 12 and cause reflection of the light coming out of the semiconductor light emitting device chip 10. That is to say, those faces inside of the encapsulating member 12 that reflect the light coming out of the semiconductor light emitting device chip 10 include the upper and lateral faces of the semiconductor light emitting device chip 10, the upper faces of the conductive and barriers 142 and 143, and the upper face of the base 141 being exposed between the conductive layer 142 and the barrier 143. Reflection by these various faces contributes to light loss inside of the encapsulating member 12. Traditionally, this light loss occurring inside of the encapsulating member 12 did not really matter in the case of emitting lights (e.g. blue light) other than ultraviolet light. This was because a reflecting face could be formed inside of the encapsulating member using a substance highly reflective for lights other than ultraviolet light. However, in semiconductor Ultraviolet light emitting devices, the light loss inside of the encapsulating member is becoming a big issue because there are not many substances available highly reflective for short wavelength ultraviolet light, and also because the conductive layer 142 requires a substance lowly reflective for ultraviolet light (e.g. Au). In particular, the light loss inside of the encapsulating member is an even bigger issue in semiconductor light emitting devices that emit, among other UV radiations, ultraviolet lights of the shortest set of wavelengths in the UV-C band. The inventors found out that if the diameter of the lower face of the encapsulating member 12 gets smaller than a certain value, a difference in $\Delta P_o$ value between the reflecting face made of a substance highly reflective for ultraviolet light and the reflecting face made of a substance lowly reflective for ultraviolet light is not significant. In particular, the inventors learned that, even with a smaller diameter of the lower face of the encapsulating member 12, the difference in $\Delta P_o$ value is around 5%, which is very little indeed. More details on this will be provided below with reference to FIG. 5 to FIG. 10.

$\Delta P_o$ (light increase rate) denotes a Po2/Po1 value, in which Po1 is an intensity of light emitted from a semiconductor light emitting device without the lens-shaped encapsulating member 12, and Po2 is an intensity of light emitted from a semiconductor light emitting device with the lens-shaped encapsulating member 12. For instance, if $\Delta P_o=150\%$, it means that intensity of light has increased by 50% after the lens-shaped encapsulating member was used. In other words, when the lens-shaped encapsulating member 12 is available, intensity of light of a semiconductor light emitting device is increased. Particularly, if the lens-shape is a hemisphere, intensity of light can be significantly increased. A first graph 15 is obtained when the reflective layer 144, the conductive layer 142 and the barrier 143 are all made of substances (e.g. Al) having reflectivity of at least 90% for ultraviolet light, and a second graph 16 is obtained when the reflective layer 144, the conductive layer 142 and the barrier 143 are all made of substances (e.g. Au) having reflectivity of 40% or less for ultraviolet light. The first graph 15 and the second graph 16 both show that ultraviolet loss due to reflection occurring inside of the lens-shaped encapsulating member 12 decreases, which results in a gradual increase in $\Delta P_o$ value. Particularly, given that the lower faces of the encapsulating member 12 have the same diameter, a greater $\Delta P_o$ value is seen in the case of the first graph 15 where substances having reflectivity of at least 90% for ultraviolet light are used, rather than in the case of the second graph 16 where substances having reflectivity of 40% or less for ultraviolet light are used. However, such a difference between the first graph 15 and the second graph 16 is reduced as the diameter of the lower face of the encapsulating member 12 gets smaller. For instance, when the diameter of the lower face of the encapsulating member is 3.4 mm (see 151, and 161), a difference in $\Delta P_o$ value between the first graph 15 and the second graph 16 is 13%. However, when the diameter of the lower face of the encapsulating member is 2.1 mm (see 152 and 162), a difference in $\Delta P_o$ value between the first graph 15 and the second graph 16 is 5%. That is, with a smaller diameter of the lower face of the encapsulating member 12, light loss due to reflection occurring inside of the encapsulating member 12 is less affected by the reflectivity for ultraviolet light of substances that form the barrier and conductive layers 143 and 142 in the encapsulating member 12. Therefore, the inventors found out that if the diameter of the lower face of the encapsulating member gets smaller than a certain value, there is no significant difference between the reflecting face made of a substance highly reflective for ultraviolet light and the reflecting face made of a substance lowly reflective for ultraviolet light, inside of the encapsulating member. Meanwhile, a difference in $\Delta P_o$ value does not continue to be reduced with smaller diameters of the lower face of the encapsulating member. In fact, once the difference in $\Delta P_o$ value is less than 5%, it remains the same (see 153 and 163).

In general, since it is preferable that a semiconductor light emitting device has a high light increase rate, ultraviolet reflecting faces (e.g. a conducive layer, a barrier, etc.) formed inside of the encapsulating member are expected to be made of substances highly reflective for ultraviolet light (e.g. Al having at least 90% reflectivity for ultraviolet light). However, if the conductive layer 142 and the barrier 143 are made of Al, for example, which is a substance having at least 90% reflectivity for ultraviolet light, and if the conductive layer 142 has a multi-layer structure, with the top layer thereof being made of Al, despite the fact that these conductive and barriers would greatly reflect ultraviolet light, such an Al layer portion of the conductive layer 142 is not well bonded to the electrode 102 of the semiconductor light emitting device chip 10 by soldering or eutectic bonding for electrical connection. In this embodiment, Au was employed to form the conductive layer 142, such that bonding between the conductive layer 142 and the electrode 102 of the semiconductor light emitting device chip 10 can be enhanced. A problem with Au, though, is that its reflectivity for ultraviolet light is 40% or less, and its $\Delta P_o$ value is thus low.

Figure 6:
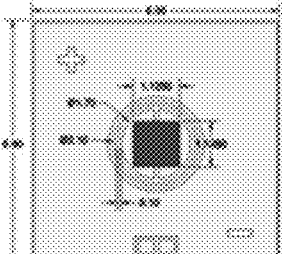
Figure 6:
Figure 6:
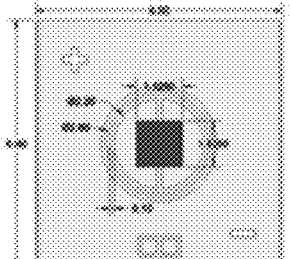
Figure 7:
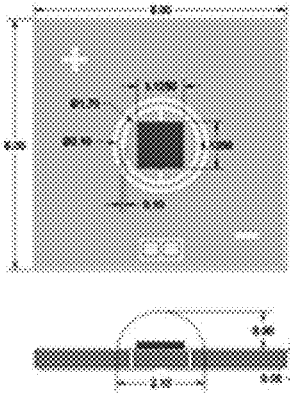
Figure 7:
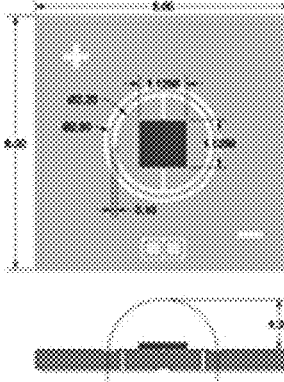
Figure 7:
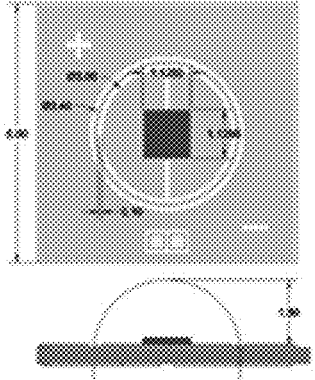

Based on the findings, the inventors, on one hand, tried to make the conductive layer 142 out of a substance that has reflectivity of less than 90% for ultraviolet light yet is well bonded with the electrode of the semiconductor light emitting device chip 10, and on the other hand, they tried to limit the diameter of the lower face of the encapsulating member 12 to a certain value in order to obtain a $\Delta P_o$ value similar to that of the conductive layer 142 made of a substance that has at least 90% reflectivity for ultraviolet light. Preferably, the diameter of the lower face of the encapsulating member 12 falls into such a range that a difference in $\Delta P_o$ value between the case of using a substance with at least 90% reflectivity for ultraviolet light and the case of a substance with reflectivity of 40% or less for ultraviolet light is no more than 5%. For example, referring to FIG. 6 and FIG. 7, illustrating different dimensions of semiconductor light emitting devices used for obtaining the graphs in FIG. 5, a difference in $\Delta P_o$ value is no more than 5% when the diameter of the lower face of the encapsulating member is 2.1 mm. Semiconductor light emitting device chips used in FIG. 6 and FIG. 7 have dimensions of 1.125 mm×1.125 mm×0.15 mm, in which the conductive layer 142, the reflective layer 144 and the barrier 143 in FIG. 6 are made of Au, while the conductive layer 142, the reflective layer 144 and the barrier 143 in FIG. 7 are made of Al. The barriers 143 are 0.1 mm wide. In addition, the flat area of each of the semiconductor light emitting devices has dimensions corresponding to those of the flat area of the external substrate 14, and those dimensions required vary depending on an application of the semiconductor light emitting device.

Figure 8A:
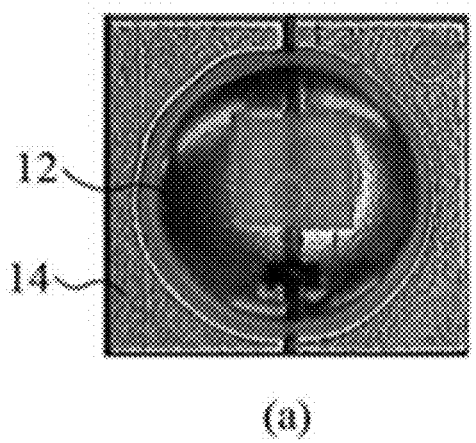
Figure 8B:
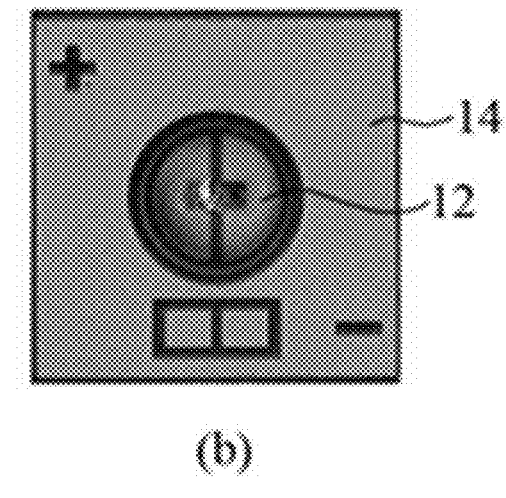
Figure 9A:
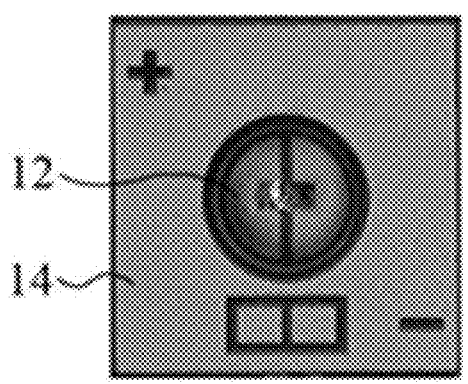
Figure 9B:
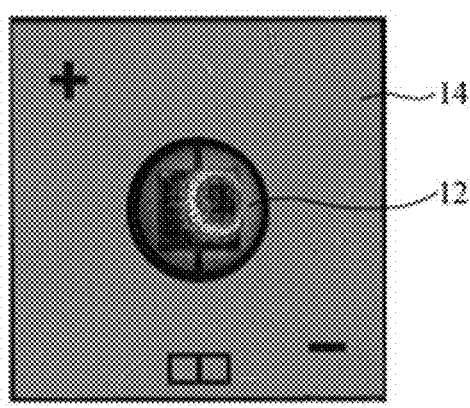

In the case of the semiconductor light emitting devices described in FIG. 6 and FIG. 7, for example, their external substrates 14 maintain a flat area of 6 mm×6 mm. However, if a difference in $\Delta P_o$ value falls within 5% due to a reduced size of the lower face of the encapsulating member 12 according to the present disclosure, a flat area portion of the external substrate 14 that is in contact with the lower face of the encapsulating member 12 can be smaller than a flat area portion of the external substrate 14 that is not in contact with the lower face of the encapsulating member 12. For better illustration, semiconductor Ultraviolet light emitting devices with the external substrate 14 having a 3.5 mm×3.5 mm flat area are compared in FIG. 8(A) and FIG. 8(B). In particular, the semiconductor light emitting device in FIG. 8(A) is a conventional one, illustrating that a flat area portion of the external substrate 14 that is in contact with the lower face of the encapsulating member 12 is larger than a flat are portion of the external substrate 14 that is not in contact with the lower face of the encapsulating member 12. This semiconductor light emitting device is designed in such a manner to adopt a bigger lens-shaped encapsulating member for having an increased intensity of light. However, the semiconductor light emitting device according to one aspect of the present disclosure in FIG. 8(B) illustrates that a flat area portion of the external substrate 14 that is in contact with the lower face of the encapsulating member 12 is smaller than a flat are portion of the external substrate 14 that is not in contact with the lower face of the encapsulating member 12. According to the findings by the inventors, a semiconductor Ultraviolet light emitting device can have an increased intensity of light by employing a smaller-diameter lower face for the lens-shaped encapsulating member. In particular, referring to FIG. 9(A) and FIG. 9(B) of semiconductor light emitting devices according to one aspect of the present disclosure, in which a flat area of the external substrate 14 in FIG. 9(A) is 3.5 mm×3.5 mm and a flat area of the external substrate 14 in FIG. 9(B) is 6 mm×6 mm, it turned out that a larger flat area of the external substrate 14 (e.g. in the case of FIG. 9(B) has a greater difference between a flat area portion of the external substrate 14 that is in contact with the lower face of the encapsulating member 12 and a flat area portion of the external substrate 14 that is not in contact with the lower face of the encapsulating member 12.

Moreover, the conductive layer 142 contributes the most to the light loss due to reflection inside of the encapsulating member. This is because the barrier 143 being 0.1 mm or less in width is not much exposed to ultraviolet light, and because the semiconductor light emitting device chip 10 having a flip chip structure includes an ultraviolet reflective layer, forming a structure highly reflective for ultraviolet light. Meanwhile, a part of the conductive layer 142 is covered with the semiconductor light emitting device chip 10 and therefore, that part is not exposed to ultraviolet light. Other parts of the conductive layer 142 uncovered with the semiconductor light emitting device chip 10 are exposed to ultraviolet light, and can greatly contribute to light loss due to the reflection inside of the encapsulating member 12. The semiconductor light emitting device chip 10 may have a flat area of varying size depending on the type of the semiconductor light emitting device chip 10. In general, according to the size of a flat area, semiconductor light emitting device chips 10 are classified into large-area chips and small-area chips. A large-area chip denotes a semiconductor light emitting device chip 10 having a flat area between 0.8 mm² and 1.5 mm², and a small-area chip denotes a semiconductor light emitting device chip 10 having a flat area between 0.06 mm² and 0.3 mm². FIG. 10 describes a total area of the conductive layer 142 and an exposed area of the conductive layer 142, in which a difference in $\Delta P_o$ value between the conductive layer 142 made of a substance having at least 90% reflectivity for ultraviolet light and the conductive layer 142 made of a substance having reflectivity of 40% or less for ultraviolet light falls within 5%, depending on the type of the semiconductor light emitting device chip 10. For instance, it shows that a difference in $\Delta P_o$ value between the conductive layer 142 made of a substance having at least 90% reflectivity for ultraviolet light and the conductive layer 142 made of a substance having reflectivity of 40% or less for ultraviolet light falls within 5%, if a large-area semiconductor light emitting device chip 10 has an area of 1.1532 mm$^2$, and the conductive layer 142 has a total area of 2.0998 mm$^2$ and an exposed area of 0.9466 mm$^2$ or less. Also, it shows that a difference in $\Delta P_o$ value between the conductive layer 142 made of a substance having at least 90% reflectivity for ultraviolet light and the conductive layer 142 made of a substance having reflectivity of 40% or less for ultraviolet light falls within 5%, if a small-area semiconductor light emitting device chip 10 has an area of 0.105 mm$^2$, and the conductive layer 142 has a total area of 0.7054 mm$^2$ and an exposed area of 0.6004 mm$^2$ or less. Referring back to FIG. 10, when a large-area chip is used, a difference in $\Delta P_o$ value between the conductive layer made of a substance having at least 90% reflectivity for ultraviolet light and the conductive layer made of a substance having reflectivity of 40% or less for ultraviolet light falls within 5%, if a ratio of the exposed area of the conductive layer 142 to the total area of the conductive layer 142 is between 37% and 45%. Meanwhile, when a small-area chip is used, a difference in $\Delta P_o$ value between the conductive layer made of a substance having at least 90% reflectivity for ultraviolet light and the conductive layer made of a substance having reflectivity of 40% or less for ultraviolet light falls within 5%, if a ratio of the exposed area of the conductive layer 142 to the total area of the conductive layer 142 is between 70% and 85%. Based on these experimental results discovered for the first time through the present disclosure and taking a flat area of a given semiconductor light emitting device chip as well as a ratio of a total area of the conductive layer 142 to an exposed area of the conductive layer 142 into consideration, it is possible to define the total area of the conductive layer such that a difference in $\Delta P_o$ value between the conductive layer made of a substance having at least 90% reflectivity for ultraviolet light and the conductive layer made of a substance having reflectivity of 40% or less for ultraviolet light falls within 5%, and to define diameter of the lower face of the encapsulating member that covers the conductive layer. The experimental results also show that a preferable exposed flat area of the conductive layer 142 is between 0.45 mm$^2$ and 1.0 mm$^2$, regardless whether a large-area chip or a small-area chip is used.

When a semiconductor light emitting device chip having a flat area other than those defined in the present disclosure is used, a ratio of a total area of the conductive layer 142 to an exposed area of the conductive layer 142, or an exposed flat area of the conductive layer 142, in which a difference in $\Delta P_o$ value between the conductive layer made of a substance having at least 90% reflectivity for ultraviolet light and the conductive layer made of a substance having reflectivity of 40% or less for ultraviolet light falls within 5%, may be out of the defined range in this disclosure, but the semiconductor light emitting device can still be included in the scope of the present invention as far as a difference in $\Delta P_o$ value between the conductive layer made of a substance having at least 90% reflectivity for ultraviolet light and the conductive layer made of a substance having reflectivity of 40% or less for ultraviolet light falls within 5%.

An experiment providing the results described in FIG. 5 to FIG. 10 is carried out by bonding semiconductor light emitting device chips of similar or equivalent performances to respective semiconductor light emitting devices. Here, the bonding process involves either soldering or eutectic bonding. Next, a first light measurement is performed to obtain a Po1 value. The light measurement can be done using Spectrometer CAS-140CT and ISP-250 integrating sphere from instrument Systems. An encapsulating member is formed into a lens shape. After that, a second light measurement is performed to obtain a Po2 value. The second light measurement is done under the same conditions as the first light measurement. These first and second light characteristics are compared to each other.

While forming the encapsulating member 12 over the conductive layer 142 may be one way to minimize the size (diameter) of the lower face of the encapsulating member 12, the conductive layers 142 has an open portion 1421 between them as shown in FIG. 4, so as to prevent an electrical short. This open portion 1421 can be filled with an insulating material. However, even after the insulating material is filled in the open portion 1421 of the encapsulating member 12, the presence of the open portion 1421 causes the encapsulating member 12 to run over the conductive layer 142 as surface tension that occurs between the lower face of the encapsulating member 12 and the upper face of the conductive layer 142 is not strong enough to keep and limit the encapsulating member 12 to only the upper face of the conductive layer 142, making this filling option less desirable. To resolve this, the barrier 143 in a closed loop form without any open section within a 200 µm distance from the conductive layer 142 is protruded from the upper face of the base 141. Particularly, since there is no reflective layer between the conductive layer 142 and the barrier 143, a groove 1422 may be formed such that the barrier 143 can serve as a dam like a wall when the encapsulating member 12 is formed. In this embodiment, however, the barrier 143 has a height equal to or lower than a height of the conductive layer 142, i.e., the barrier 143 is not high enough to work as a dam like a wall. Nevertheless, as described in FIG. 4, the barrier 143 will suffice for serving as a dam at least, with the help of surface tension occurring between the upper face of the barrier 143 and the lower face of the encapsulating member 12, for preventing the encapsulating member 12 from running over the barrier 143. While the barrier 143 illustrated in FIG. 4 has a closed loop shape, it may adopt other shapes including a circle or a square, if needed. Additionally, in this embodiment, while the barrier and the conductive layer in contact with the lower face of the encapsulating member are made of Au, other metallic substances (e.g. Ag) that are lowly reflective for ultraviolet light and can be bonded well to a semiconductor light emitting device chip by soldering or eutectic bonding may also be used. Further, while substances having reflectivity as low as 40% for ultraviolet light as well as substances (e.g. Al) having high reflectivity (e.g. at least 90%) for ultraviolet light to have a high $\Delta P_o$ value even for a semiconductor Ultraviolet light emitting device are introduced as preferred examples and included in this embodiment, other substances (e.g. having reflectivity less than 90%) are also within the scope of the present disclosure.

FIG. 11 shows a conventional semiconductor light emitting device, which is taken as a comparison for explaining merits of a semiconductor light emitting device according to the present disclosure.

Referring to the semiconductor light emitting device in FIG. 11(A), a preformed lens L is attached onto a semiconductor light emitting device chip 10a.

According to the present disclosure, however, the encapsulating member 12 made of a light-transmitting thermoplastic resin is formed into a lens shape. Therefore, there is no need to prepare a separate lens, and a resulting semiconductor light emitting device can be made in an even smaller size. Further, the size of the encapsulating member 12 can be controlled efficiently by using the barrier 143. Meanwhile, when a liquid-phase light-transmitting thermoplastic resin having at least 80% UV transmissivity is cured and solidified, a solvent therein is mostly volatilized, reducing a total volume by 90% or more. For this reason, it was not easy to obtain a lens-shaped encapsulating member 12 with such a liquid-phase light-transmitting thermoplastic resin having at least 80% UV transmissivity. The present disclosure resolved this problem, and successfully formed the lens-shaped encapsulating member 12 with a light-transmitting thermoplastic resin having at least 80% UV transmissivity. Not only is the lens-shaped encapsulating member 12 made of a light-transmitting thermoplastic resin having at least 80% UV transmissivity as aforementioned, but it also is adapted to get entirely exposed to outside, except a portion on the lower face of the encapsulating member 12 that surrounds the semiconductor light emitting device chip 10 and comes in contact with the external substrate 14. In this way, ultraviolet light coming out of the semiconductor light emitting device chip 10 passes through the encapsulating member 12 and travels in all directions, except for the direction of the external substrate 14. In an alternative, it is possible to use conventional liquid-phase light-transmitting thermoplastic resins that do not undergo a significant volume loss while being cured (e.g. PMMA (Poly Methyl Methacrylate), PC (Poly Carbonate) or the like) to form a lens shape for the encapsulating member. However, when the semiconductor light emitting device chip 10 emits ultraviolet light, the lens thus formed is not much useful as it has a low UV transmissivity and is vulnerable to degradation. Hence, instead of light-transmitting thermoplastic resins, other materials such as glass, sapphire or quartz were traditionally used for forming a lens. All of these problems were then resolved by the present disclosure, in which the lens-shaped encapsulating member 12 is made of a light-transmitting thermoplastic resin that has at least 80% transmissivity and is not vulnerable to UV degradation.

As light extraction efficiency varies depending on the refractive index of a lens, a difference in refractive index existing between air and an outermost medium in contact with the air should be minimized. For instance, referring to FIG. 11(B), there is a hollow space A between the lens L and the semiconductor light emitting device chip 10b, and suppose that the lens L is made of sapphire having the refractive index of 1.8 or quartz having the refractive index of 1.54. Then refractive index changes may not be in order, from the semiconductor light emitting device chip 10b towards air, i.e., 1 (A)-1.54 (L) or 1.8 (L)-1 (air), such that light loss can occur.

In the present disclosure, however, because the semiconductor light emitting device chip 10 is in contact with and surrounded by the encapsulating member 12, there is no space between them. Assuming that the light-transmitting thermoplastic resin used for the encapsulating member 12 has the refractive index of 1.3, refractive index changes may be in order, from the semiconductor light emitting device chip 10 towards air, i.e. 1.3 (12)-1 (air), such that light loss will not occur. As such, it is now possible to effectively prevent the phenomenon of total reflection that occurs on the interface when light is incident upon a medium of lesser index of refraction from a medium of greater index of refraction, and therefore, light extraction efficiency can be increased even more.

FIG. 12 to FIG. 15 will now be referred to describe a method of forming the encapsulating member 12 with a light-transmitting thermoplastic resin that has at least 80% UV transmissivity and undergoes a significant volume change while being cured from liquid phase. The encapsulating member 12 can have a convex hemispherical lens shape, but it is not limited thereto. For example, the encapsulating member 12 may have a concave lens, flat-top lens, meniscus lens, conical lens or different geographical structure lens shape. The shape of a lens affects light distribution properties. Therefore, the lens can be shaped to meet the requirements for the extraction efficiency and light distribution properties.

FIG. 12 shows an example of a method of manufacturing semiconductor light emitting devices according to one aspect of the present disclosure.

Figure 12A:
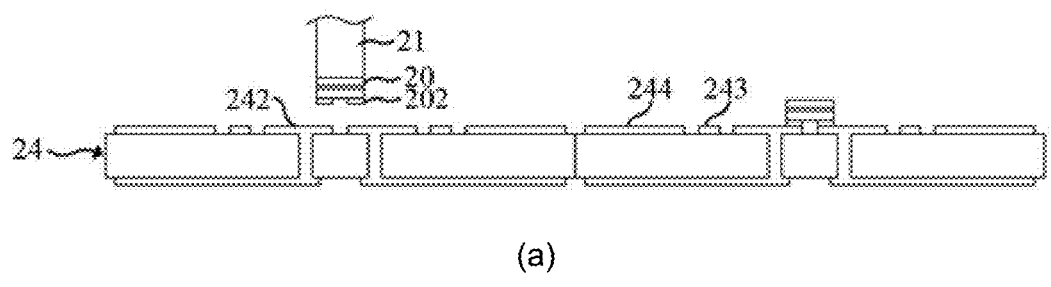
FIGS. 12A, 12B, 12C and 12D shows an example of a method of manufacturing semiconductor light emitting devices according to one aspect of the present disclosure.

Referring to FIG. 12(A), in the method of manufacturing semiconductor light emitting devices, an external substrate 24 is first prepared, and semiconductor light emitting device chips 20 are placed over the external substrate 24 in such a way that a plurality of electrodes 202 of each semiconductor light emitting device chip 20 is arranged to face conductive layers 242 of the external substrate 24. The conductive layers 242 of the external substrate 24 are then electrically connected with the plurality of electrodes 202 of the semiconductor light emitting device chip 20. Therefore, preparing an external substrate means forming conductive layers, a barrier and a reflective layer on the base.

The semiconductor light emitting device chips 20 are placed over the external substrate 24 with the help of a device carrier 21, which recognizes shapes, patterns or edges of the conductive, barrier and reflective layers 242, 243 and 244 formed on the external substrate 24 and then calibrates location and angle of the device to be placed.

Figure 12B:
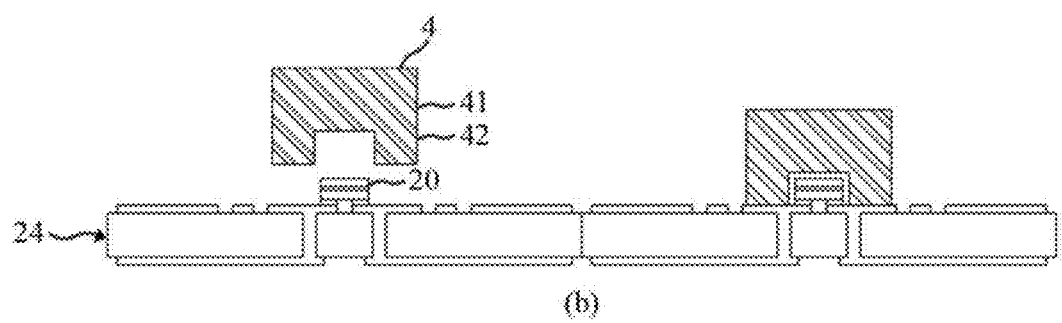

Next, solid, preliminary encapsulating members 4 made of a light-transmitting thermoplastic resin having at least 80% UV transmissivity are placed to surround each semiconductor light emitting device chip 20, as shown in FIG. 12(B). The preliminary encapsulating member 4 is arranged over the external substrate 24 and semiconductor light emitting device chip 20, with the help of the device carrier 21. Here, the preliminary encapsulating member 4 can be arranged at a predefined distance from the semiconductor light emitting device chip 20.

The preliminary encapsulating member 4 can be obtained by curing or hardening a liquid-phase light-transmitting thermoplastic resin having at least 80% UV transmissivity. For instance, when the liquid-phase light-transmitting thermoplastic resin is cured, about 90% or more of its volume is reduced to yield the solid preliminary encapsulating member 4. A detailed illustration of the preliminary member 4 is provided in FIG. 13.

Since the preliminary encapsulating member 4 is arranged to be able to surround the semiconductor light emitting device chip 20, it is desirable that a groove 43 in a body 41 of the preliminary encapsulating member 4 is wider than the semiconductor light emitting device chip 20, and a supporting part 42 is taller than the semiconductor light emitting device chip 20. The method of forming the preliminary encapsulating member 14 is continued in FIG. 14 and FIG. 15 below.

Figure 12C:
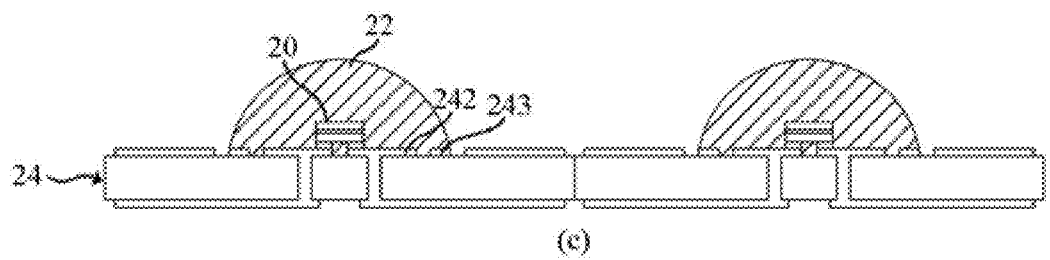

Referring now to FIG. 12(C), the preliminary encapsulating member 4 is thermally cured and formed into a hemispherical-shaped encapsulating member 22 that surrounds the semiconductor light emitting device chip 20. Alternatively, the encapsulating member 22 may be formed into a convex hemispherical lens shape, but it is not limited thereto.

A significant volume change is not observed when the preliminary encapsulating member 4 is thermally cured to form the encapsulating member 22. As shown in FIG. 14 and FIG. 15, the preliminary encapsulating member 4 has already a reduction in at least 90% of the volume of the liquid-phase light-transmitting thermoplastic resin 50 having at least 80% UV transmissivity. Accordingly, a volume change rate from the preliminary encapsulating member 4 to the encapsulating member 22 could be no more than 2%. Because the volume change rate from the preliminary encapsulating member 4 to the encapsulating member 22 is no more than 2%, the encapsulating member 22 can be formed into different lens shapes, besides the convex hemispherical lens shape. In other words, such a little change in volume during the curing process after the preliminary encapsulating member 4 has melted into a liquid phase can be advantageous for producing any desired lens shape (e.g. a convex, concave or conical lens shape) without difficulty.

When the preliminary encapsulating member 4 is thermally cured, surface tension between the preliminary encapsulating member 4 and the barrier 243 of the external substrate 24 will not let the encapsulating member 22 thus formed run over the barrier 243. The barrier 243 can be formed at the same time with the conductive layers 242 of the external substrate 24, or alternatively, it can be formed through a separate process. When the barrier 243 is formed simultaneously with the conductive layers, the overall manufacturing process is shortened, and an amount of time and cost for manufacturing can be reduced accordingly.

Heat treatment and/or drying operations for thermally curing the preliminary encapsulating member 4 is preferably carried out at a high temperature, for example, between 200° C. and 300° C. for about 4 to 6 hours. Although these temperature and time period ranges for the heat treatment and/or drying operations are set to cause a solid resin layer 4 to have an evenly flat upper face after being cured, and to establish a stable bonding to the semiconductor light emitting device chip 20 and to the external substrate 24, they are not limited thereto. Bubbles may be created during the curing process at a high temperature, but those bubbles can be eliminated with a vacuum oven.

Figure 12D:
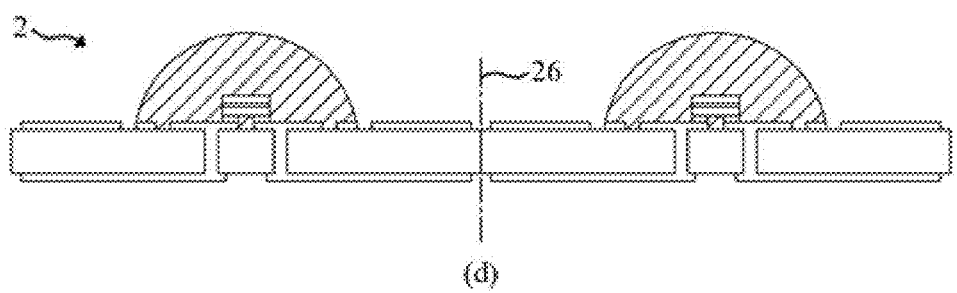

Next, the external substrate is scribed along a scribe line 26 as shown in FIG. 12(D), and individual semiconductor light emitting devices 2 are obtained.

Figure 13:
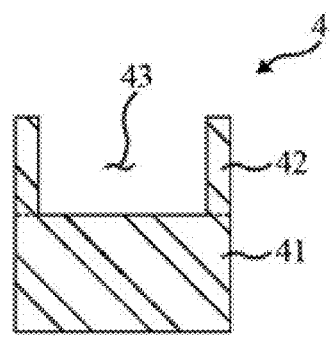
FIG. 13 shows an example of a preliminary encapsulating member according to one aspect of the present disclosure.

FIG. 13 shows an example of the preliminary encapsulating member 4 according to one aspect of the present disclosure.

The preliminary encapsulating member 4 includes a body 41 with a groove 43, and a supporting part 42 connected to a lateral face of the body 41.

FIG. 14 to FIG. 15 show an example of a method of forming a preliminary encapsulating member 4 with a light-transmitting thermoplastic resin having at least 80% UV transmissivity, according to one aspect of the present disclosure.

Referring to FIG. 14 and FIG. 15, the preliminary encapsulating member 4 is formed by shrinkage and heat compression.

Figure 14A:
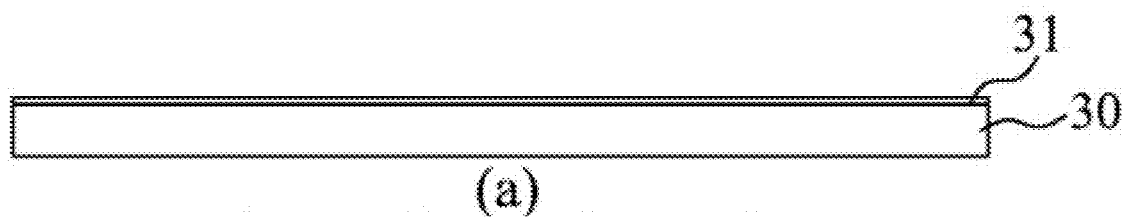
FIGS. 14A, 14B, 14C, 14D, 14E, 14F, 14G, 14H, 14I, and 14J and FIGS. 15A, 15B and 15C show an example of a method of forming a preliminary encapsulating member with a light-transmitting thermoplastic resin having at least 80% UV transmissivity, according to one aspect of the present disclosure.

In particular, as shown in FIG. 14(A), a photoresistor layer 31 is formed on a first base layer 30. The photoresistor layer 31 can be formed by screen printing a photoresist paste.

Figure 14B:
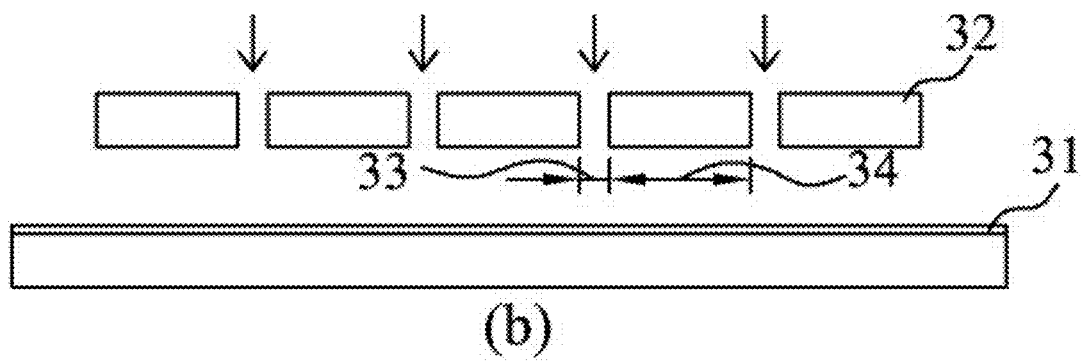

Next, as shown in FIG. 14(B), a mask 32 having a predefined pattern is arranged on the photoresistor layer 31 and exposed to ultraviolet light. The mask 32 has a pattern that exposes first regions 33.

When the photoresistor layer 31 is subject to ultraviolet irradiation, photoresistor layer portions in the exposed first regions 33 through the mask 32 pattern are photocured more firmly, while photoresistor layer portions in second regions 34 that are not exposed to ultraviolet irradiation through the mask 32 are not photocured.

Figure 14C:
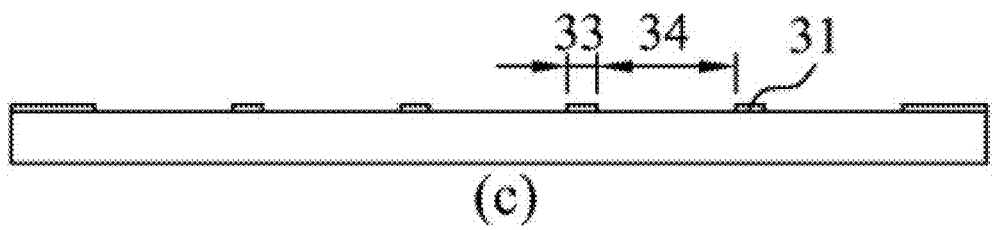

Referring next to FIG. 14(C) through development, the photoresist layer portions in the second regions 34, not the photocured photoresist layer portions in the first regions 33, are removed and etched away. For instance, such an etching process can be done by wet etching. When a sample is dipped into a developing solution based on an inorganic acid including at least one of hydrofluoric acid, nitric acid, acetic acid, sulfuric acid and hydrochloric acid and developed, the photoresistor layer 31 in unexposed portions, i.e., the second regions 34, is removed to expose the underlying first base 30, while the photoresistor layer 31 in the first regions 33 other than the second regions 34 is retained.

Figure 14D:
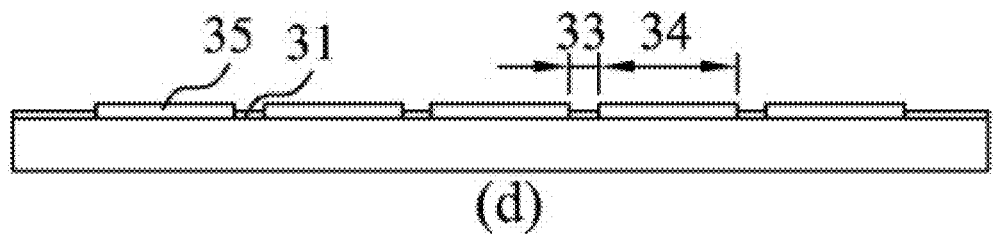

A metal layer 35 is then formed in each second region 34 where the first base layer is exposed by etching, as shown in FIG. 14(D). The metal layer 35 is not formed in the first regions 33.

The metal layer 35 may have a height greater than a height of the photoresistor layer 31, but alternatively, it may have a height equal to or less than a height of the photoresistor layer 31. Examples of a substance for the metal layer 35 include Au, Al and Ag. The metal layer 35 is preferably formed by deposition including PECVD such as e-beam deposition, and CVD, but it is not limited thereto.

Figure 14E:
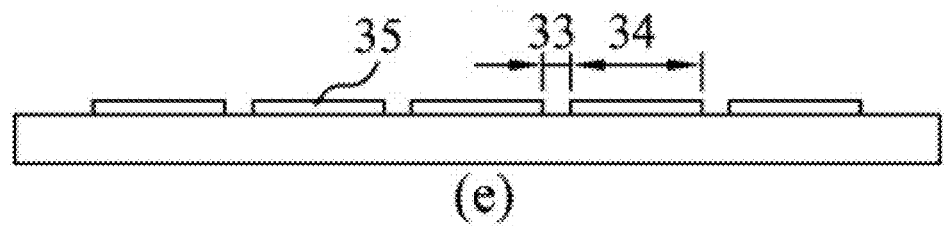

Referring to FIG. 14(E), a lift-off process is performed to remove the photoresistor layer 31 located in the first regions 33. As a result, only the metal layer 35 is present in the second regions 34 on the first base layer 30. The metal layer 35 is intended to enhance bonding strength during the solder bonding with a dummy semiconductor light emitting device chip 36 as shown in FIG. 14(F).

The photoresistor layer 31 located in the first regions 33 can be removed through the lift off process, using an acidic solution, such as, dilute hydrofluoric acid (DHF) or $HNO_3$.

Figure 14F:
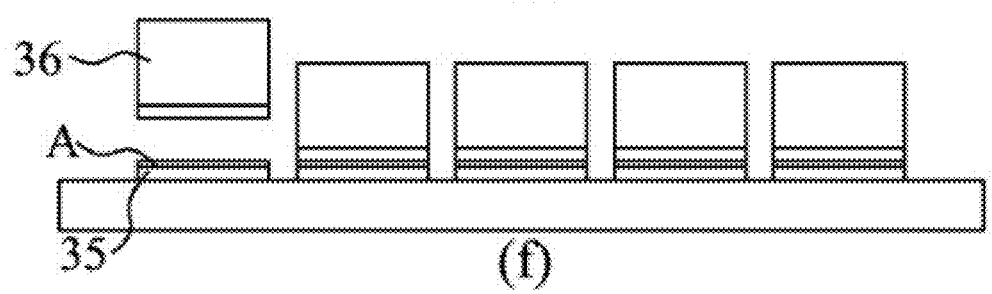

Referring next to FIG. 14(F), dummy semiconductor light emitting device chips 36 are placed on the respective metal layers 35. The metal layer 35 and the dummy semiconductor light emitting device chips 36 can be bonded to each other when compressed by an external force, or with the help of an adhesive material A. Examples of the adhesive material A include a conductive pastes, an insulating paste, a polymer adhesive, and an AuSn solder, but they are not limited thereto.

The dummy semiconductor light emitting device chip 36 in this embodiment is formed in larger size than the semiconductor light emitting device chip 10 illustrated in FIG. 4, but alternatively, it may be equal to or smaller.

Figure 14G:
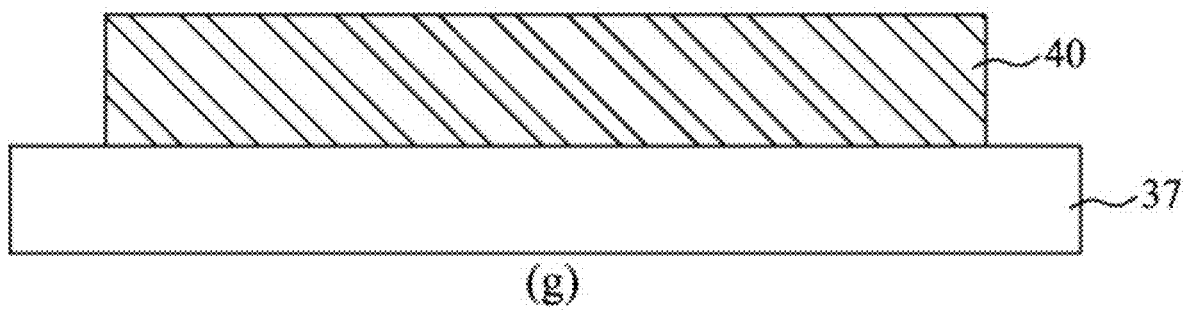

The bonded dummy semiconductor light emitting device chips 36 and metal layer 35 on the first base layer 30 in one piece is then arranged opposite to a preliminary encapsulating member substrate 40 on a second base layer 37, as shown in FIG. 14(G). In particular, the upper faces of the dummy semiconductor light emitting device chips 36 are arranged in face-to-face relation to the upper face of the preliminary encapsulating member substrate 40.

The second base layer 37 is preferably a hot plate maintained at a high temperature, e.g. about 200° C. As such, the preliminary encapsulating member substrate 40 placed on the second base layer 37 is in a flexible state.

The preliminary encapsulating member substrate 40 has the form of a planar block with flat upper and lower faces, and is made of a light-transmitting thermoplastic resin having at least 80% UV transmissivity. More specifically, referring to FIG. 15(A), a liquid-phase light-transmitting thermoplastic resin 50 having at least 80% UV transmissivity is injected to a rigid frame (or mold) 52 with the help of a first delivery unit 51.

The rigid frame 52 can be a rigid metallic or non-metallic plate, and is preferably made of somewhat hard materials suitable for retaining the form of the liquid-phase light-transmitting thermoplastic resin 50 having at least 80% UV transmissivity. Examples of such materials include Al, Cu, Ag, a Cu—Al alloy, a Cu—Ag alloy, a Cu—Au alloy, and SUS (stainless steel). A plated plate is also applicable.

Figure 15A:
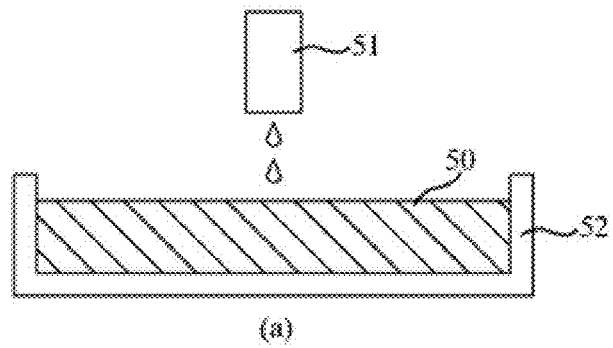
Figure 15B:
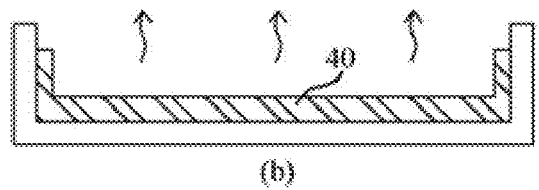

Turning next to FIG. 15(B), the resin 50 is thermally cured to yield a solid preliminary encapsulating member substrate 40. After heat-curing is done, the resulting preliminary encapsulating member substrate 40 shows a reduction in at least 50%, preferably at least 90%, of the volume of the liquid-phase light-transmitting thermoplastic resin 50 having at least 80% UV transmissivity. The volume is significantly reduced because a solvent in the liquid-phase light-transmitting thermoplastic resin 50 is volatilized during the heat-curing process.

The heat-curing process for curing the liquid-phase light-transmitting thermoplastic resin 50 is carried out at a temperature between 200° C. and 300° C. for about 15 to 20 hours, for example. Preferably, the heat-curing process is carried out at 250° C. for 18 hours. Although these temperature and time period ranges for the heat treatment and/or drying operations are set to cause the liquid-phase light-transmitting thermoplastic resin 50 to be cured at once in order to have an evenly flat upper face, and to be stably bonded to the semiconductor light emitting device chip 20, they are not limited thereto.

Figure 15C:
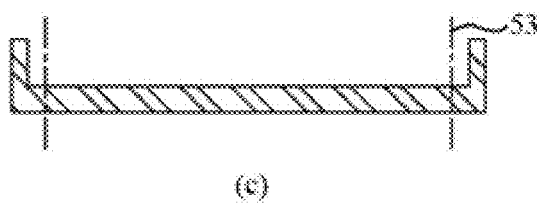

The preliminary encapsulating member substrate 40 is then separated from the rigid frame 52 and scribed along a scribe line 53 in order to obtain a separate preliminary encapsulating member substrate 40 having flat upper and lower faces, as shown in FIG. 15(C).

Figure 14H:
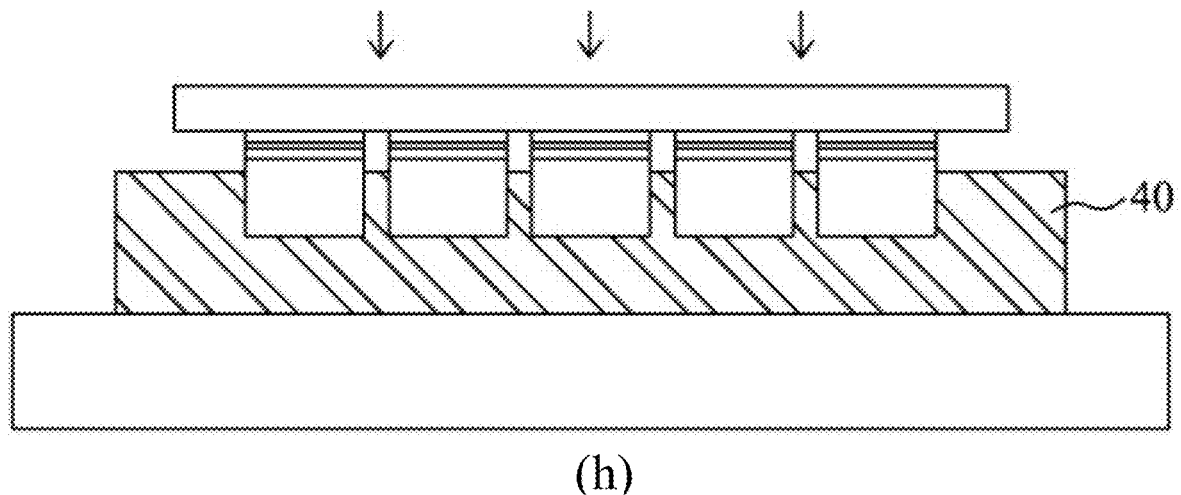

Going back to FIG. 14(H), the preliminary encapsulating member substrate 40 is heat-compressed by the dummy semiconductor light emitting device chips 36. This is possible because the preliminary encapsulating member substrate 40 is in a flexible state due to the second base layer 37 maintained at a high temperature, as mentioned above.

Figure 14I:
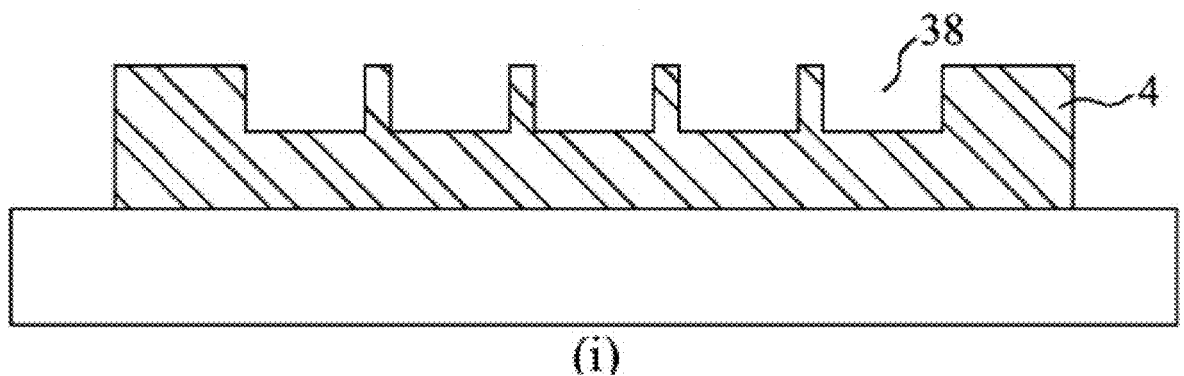

Next, as shown in FIG. 14(I), a solid preliminary encapsulating member 4 with a plurality of grooves 38 is formed, and each groove has a shape corresponding to the dummy semiconductor light emitting device chip 36. The plurality of grooves 38 preferably have the same height as the dummy semiconductor light emitting device chips 36, but alternatively, it may have a greater height than the dummy semiconductor light emitting device chips 36.

Figure 14J:
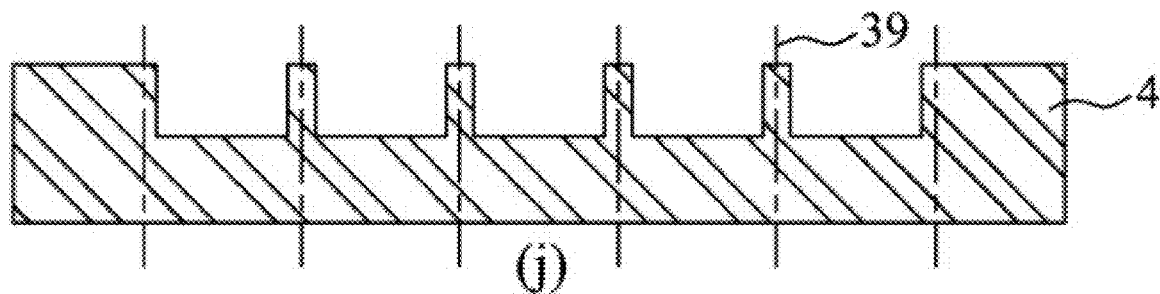

Then, as shown in FIG. 14(J), the preliminary encapsulating member 4 is cut along cutting lines 39 to yield individual preliminary encapsulating members 4 with grooves 38, respectively.

FIG. 16 shows problems that can be present in the prior-art encapsulating member produced with a liquid-phase light-transmitting thermoplastic resin having at least 80% UV transmissivity.

In case of producing an encapsulating member directly by heat-curing a liquid-phase light-transmitting thermoplastic resin having at least 80% UV transmissivity, the volume of the liquid-phase light-transmitting thermoplastic resin being coated is reduced by about 90% or more. Therefore, the liquid-phase light-transmitting thermoplastic resin must go through a coating and a heat-curing process over and over until a desirable shaped encapsulating member is obtained.

The repeated coating and heat-curing processes performed on the liquid-phase light-transmitting thermoplastic resin can eventually increase the overall manufacturing process time and cost.

Figure 16A:
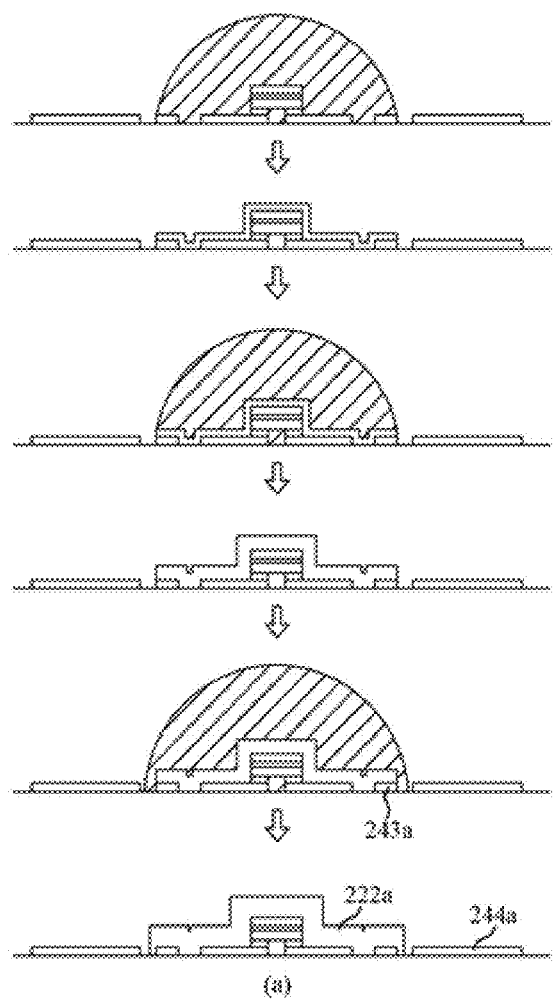
FIGS. 16A and 16B shows problems that can be present in the prior-art encapsulating member produced with a liquid-phase light-transmitting thermoplastic resin having at least 80% UV transmissivity.

For instance, referring to FIG. 16(A), while the liquid-phase light-transmitting thermoplastic resin is being repeatedly coated and heat-cured, an encapsulating member 222a thus formed may run over a barrier 243a. Accordingly, the encapsulating member 222a might not be formed into a convex hemispherical lens shape. As a result, light distribution will not be smooth, leading to lower light extraction efficiency and poorer reliability of the semiconductor light emitting device. Moreover, if the encapsulating member 222a runs over a barrier 243a, it might as well cover a reflective layer 244a, which in turn deteriorates the reflection efficiency of the reflective layer 244a and further, the light extraction efficiency.

Figure 16B:
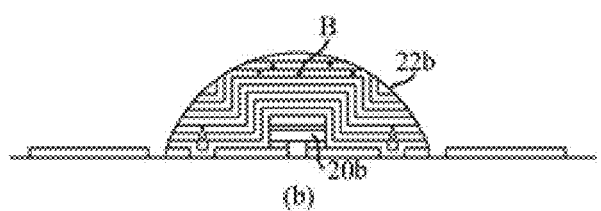

In addition, as shown in FIG. 16(B), bubbles may be created within the encapsulating member 22b due to those repeated coating and heat-curing processes on the liquid-phase light-transmitting thermoplastic resin. In other words, when the coating and heat-curing processes are carried out over and over to make the encapsulating member 22b into a convex hemispherical lens shape, it also means that the encapsulating member 22b has been cured many times over. As such, bubbles B may be created in the liquid-phase light-transmitting thermoplastic resin being applied, and the surface or inside of the cured encapsulating member 22b. Due to the presence of bubbles B created inside of the encapsulating member 22b, the encapsulating member 22b will not be evenly surfaced and fail to achieve smooth spreading of light from the semiconductor light emitting device chip 20b, leading to poorer reliability of the device.

FIG. 17 shows an example of a method of manufacturing semiconductor light emitting devices according to one aspect of the present disclosure.

Figure 17A:
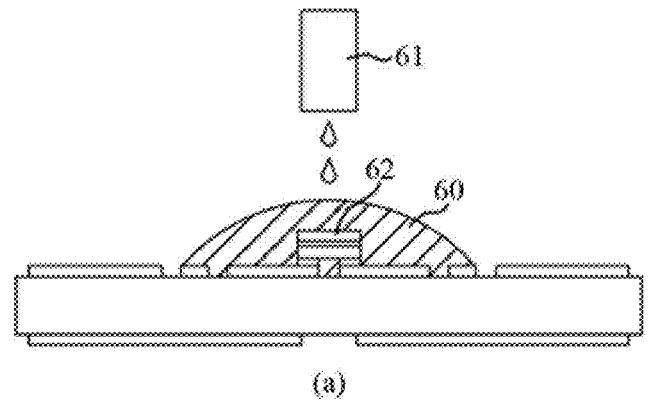
FIGS. 17A, 17B and 17C shows an example of a method of manufacturing semiconductor light emitting devices according to one aspect of the present disclosure.

Referring to FIG. 17(A), a liquid-phase light-transmitting thermoplastic resin having at least 80% UV transmissivity is coated to form a liquid-phase resin layer 60, and this is carried out prior to the process described in FIG. 12(B), that is, before the preliminary encapsulating member 4 is placed to surround the semiconductor light emitting device chip 20. Here, a second delivery unit 61 having the same function as the first delivery unit 51 in FIG. 15(A) is employed to place the liquid-phase light-transmitting thermoplastic resin having at least 80% UV transmissivity to surround a semiconductor light emitting device chip 62.

Figure 17B:
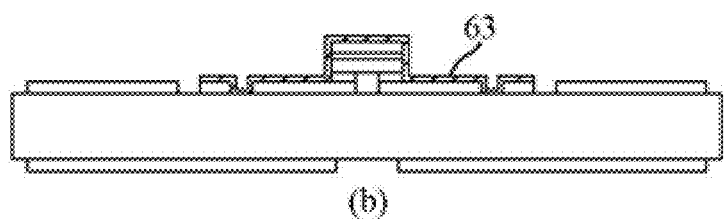

Referring next to FIG. 17(B), the liquid-phase resin layer 60 is heat-cured to form an encapsulating material layer 63. A solvent in the encapsulating material layer 63 is volatilized during the heat-curing process, and the resulting encapsulating material layer 63 shows a reduction in at least 50%, preferably at least 90%, of the volume of the liquid-phase resin layer 60. In this disclosure, the encapsulating material layer 63 is preferably about 10 μm thick.

Figure 17C:
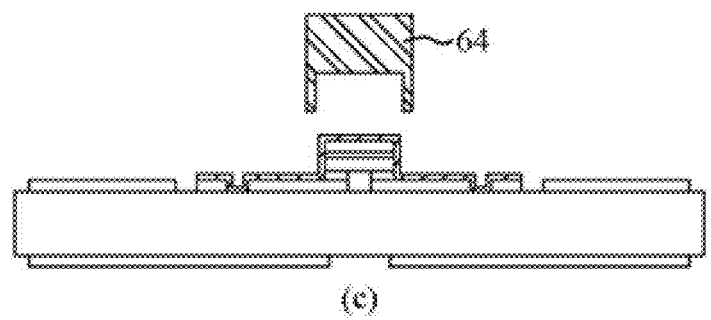

A preliminary encapsulating member 64 is then placed on the encapsulating material layer 63 to form an encapsulating ember 22, as shown in FIG. 17(C). As the encapsulating material layer 63 and the preliminary encapsulating member 64 are made of the same substance, the encapsulating material layer 63 is melted into the preliminary encapsulating member 64 during the heat-curing process for forming the encapsulating member 22. In the formation of a lens-shaped encapsulating member from the preliminary encapsulating member 64 by heat-curing, the presence of the encapsulating material layer 63 contributes to a reduced curing time for obtaining the lens shape, as compared with the case where the encapsulating material layer 63 is absent. Moreover, as the encapsulating material layer 63 readily sits in between the electrodes of a semiconductor light emitting device chip, adhesion between the external substrate and the semiconductor light emitting device chip is improved.

A method of forming the encapsulating member 22 from the preliminary encapsulating member 64 is substantially the same as the manufacturing method of a semiconductor light emitting device described in FIG. 12(B). An example of light-transmitting thermoplastic resins that have at least 80% UV transmissivity and are not vulnerable to UV degradation is Teflon Af product group available from DuPont.

FIG. 18 shows an example of a semiconductor light emitting device 1 according to one aspect of the present disclosure, in which FIG. 18(A) is a cross sectional view taken along AA', and FIG. 18(B) is a top view.

The semiconductor light emitting device 1 includes a semiconductor light emitting device chip 10, an encapsulating member 12, and an external substrate 14.

The semiconductor light emitting device chip 10 includes a plurality of semiconductor layers including an active layer 101 adapted to generate light by recombination of electrons and holes, and electrodes 102 electrically connected to the plurality of semiconductor layers. The semiconductor light emitting device chip 10 is preferably a flip chip, in which the electrodes 102 are exposed from the encapsulating member 12. While the semiconductor light emitting device chip 10 illustrated in this disclosure is a flip chip, it may be, without limitation, a lateral chip or a vertical chip. The active layer 101 is also shown in a magnified view for clearer description.

The encapsulating member 12 is formed over the external substrate 14 to surround the semiconductor light emitting device chip 10. The encapsulating member 12 may be made of a light-transmitting substance, or a light-transmitting substance containing a wavelength converting material (not shown). The light-transmitting substance can be at least one of epoxy resins or silicon resins. Any material (e.g., pigments, dyes or the like) can be used for the wavelength converting material as long as it converts light generated from the active layer 101 of the semiconductor light emitting device chip 10 into light with a different wavelength, but phosphors (e.g., YAG, $(Sr,Ba,Ca)_2SiO_4$:Eu or the like) are preferably used due to their high efficiency of light conversion). In addition, the wavelength converting material can be selected depending on the color of light from a semiconductor light emitting device 1, which again is well known to those skilled in the art. Similar to a lens, the encapsulating member 12 allows for uniform light conversion and uniform light emission of the light from the semiconductor light emitting device chip 10. The encapsulating member 12 can have a convex hemispherical lens shape, but it is not limited thereto. For example, the encapsulating member 12 may have a concave lens, flat-top lens, meniscus lens, conical lens or different geographical structure lens shape. The shape of a lens affects light distribution properties. Therefore, the lens can be shaped to meet the requirements for the extraction efficiency and light distribution properties.

In order to form the encapsulating member 12 around the semiconductor light emitting device chip 10, a light-transmitting substance containing a wavelength converting material (not shown) can be applied by spray coating, or can be directly coated over the semiconductor light emitting device chip. Alternatively, the encapsulating member 12 can be formed by coating the semiconductor light emitting device chip 10 with a light-transmitting substance containing wavelength converting material, followed by settling the wavelength converting material.

The external substrate 14 may be any type of substrate that provides a region for mounting the light emitting device chip 10 thereon. Examples of the external substrate include a substrate having reed electrodes, a printed circuit board, and a metal plate (substrate).

The external substrate 14 can include a base 141, conductive layers 142, an insulating layer 143, a reflective layer 144, and a barrier 145. Here, the conductive layers 142, the insulating layer 143, the reflective layer 144, and the barrier 145, which are arranged over the base 141, preferably have the same height.

The base 141 may contain an insulating material, or a material of high heat conductivity. For example, it may contain a highly heat conductive polymer and/or ceramic material. In particular, the base 141 may contain an AlN ceramic material. As a result, during the operation of the semiconductor light emitting device 10, heat generated therein can be effectively discharged to the outside through the base 141.

The conductive layers 142, passing through the base 141, are formed on the upper and lower faces of the base 141, and electrically connected to the electrodes 102 of the semiconductor light emitting device chip 10. The conductive layers 142 may contain an electrically conducting substance, and may contain a metal such as Ni, Pt, Pd, Rh, W, Ti, Al, Ag, Au or Cu. The semiconductor light emitting device 1 is electrically connected to the outside through these conductive layers 142 formed on the lower face of the base 141. As illustrated in FIG. 4, the conductive layers 142 have a quadrangular shape if seen from the top, but it is not limited thereto. The conductive layers 142 can have a circular or semicircular shape. When the conductive layers 142 are formed into a circular shape, they can have a diameter of 1 mm or less.

The electrodes 102 of the semiconductor light emitting device chip 10 are preferably arranged to face towards the external substrate 14 to be electrically connected to the conductive layers 142 of the external substrate 14.

The insulating layer 143 is formed between the conductive layers 142 arranged correspondingly to the electrodes 102 of the semiconductor light emitting device chip 10, and can be made of an insulating material. For instance, the insulating layer 143 can be made of an adhesive insulating paste. Alternatively, the insulating layer 143 can be omitted.

The reflective layer 144 is formed on the upper face of the base 141. The reflective layer 144 includes a first reflective layer part 1440 which is arranged facing the lower face of the encapsulating member 12, and a second reflective layer part 1441 which is separated by the barrier 145 from the first reflective layer part 1440 and is not covered with the encapsulating member 12. Here, the first reflective layer part 1440 and the second reflective layer part 1441 preferably have the same height.

Among the light from the semiconductor light emitting device chip 10, a portion of the light directed towards the external substrate 14 is reflected by the reflective layer 144 formed on the upper face of the base 141 and emitted outside the device. As aforementioned, the second reflective layer part 1441 is separated by the barrier 145 from the first reflective layer part 1440, and there is also a predefined gap, e.g. up to 200 μm, between the second reflective layer part 1441 and the barrier 145, but there is no light loss due to this gap between the second reflective layer part 1441 and the barrier 145. Accordingly, an amount of light being extracted is increased, which in turn increases the light extraction efficiency of the semiconductor light emitting device. The semiconductor light emitting device chip 10 of the present disclosure can emit light in a wavelength band of ultraviolet light, in particular, light of a peak wavelength in that wavelength band. For example, the semiconductor light emitting device chip 10 can emit light having a peak wavelength of not greater than 400 nm. A preferable wavelength band ranges from 365 nm to 400 nm.

The reflective layer 144 can be made of a translucent reflective substance, such as Al or white silicon. Preferably, the reflective layer 144 can be formed, without limitation, by screen printing in case of using white silicon; the reflective layer 144 can be formed by PECVD (e.g. e-beam deposition) or CVD screen printing in case of using Al. In particular, the first reflective layer part 1400 is preferably made of insulating white silicon, and the second reflective layer part 1441 is preferably made of Al that has a high reflection efficiency for ultraviolet light.

Compared with the reflective layer 144 made of Ag, the reflective layer 144 made of Al or white silicon resists to discoloration caused by ultraviolet light emitted from the semiconductor light emitting device chip 10 and retains a high reflectivity. As a result, the reliability as well as light extraction efficiency of the semiconductor light emitting device can be improved.

Preferably, the reflective layer 144 has a height equal to or less than a height of the conductive layer 142. In particular, the reflective layer 144 preferably has a height between 150 μm and 500 μm. If the reflective layer 144 is made of insulating white silicon and has a height of 150 μm or less, light gets transmitted through the reflective layer 144 and the reflection effect is therefore lowered. If the reflective layer has a height of 500 μm or greater, it may be difficult to produce an external substrate as the electrode width and plating ratio should be considered, and thermal resistance depending on the thickness of plating can be an issue.

The barrier 145 is placed at a predefined distance from the conductive layer 142 on the upper face of the base 141, and made of a metal such as Ni, Pt, Pd, Rh, W, Ti, Al, Ag, Au or Cu. As the barrier 145, which is made of a metal, is separated by the insulating first reflective layer part 1440 from the conductive layer 142, any contact between the barrier 145 and the conductive layer 142 is avoided, thus lowering the risk of an electrical short.

The barrier 145 can be used as a stopper wall, i.e. a dam, for keeping the encapsulating member 12 from running over the barrier 1453 when the encapsulating member 12 is formed. Alternatively, the barrier 145 can be omitted. The barrier 145 is preferably made of a material, which not only is sufficiently firm or hard to maintain the shape of the encapsulating member 12 protecting the semiconductor light emitting device chip 10, but which is also effective for avoiding cracks or splits.

Alternatively, the barrier 145 can be made of a colored reflective substance that reflects light from the semiconductor light emitting device chip 10 towards the encapsulating member 12, but it is not limited thereto.

Moreover, the barrier 145 can be made of a metal other than a silicon-based material such that bonding strength to the base 141 or to the encapsulating member 12 is enhanced, which in turn improves the reliability of a semiconductor light emitting device. Additionally, when a metallic substance is used, the barrier 145 can be formed at the same time with the conductive layer 142. As a result, the overall manufacturing process is shortened, and an amount of time and cost for manufacturing can be reduced accordingly.

Although the barrier 145 serves as a dam, it does not mean that it serves as a wall that stops the overflow of a resin of the encapsulating member 12. Rather, the encapsulating member 12 does not run over the barrier 145 because of surface tension created between the upper face of the barrier 145 and the lower face of the encapsulating member 12 during the formation of the encapsulating member 12. Thus, the encapsulating member 12 can be adapted to cover all or only a part of the upper face of the barrier 145. Because the effects of surface tension that are created between the encapsulating member 12 and an upper face 1451 of the barrier 145 are maximized on a corner where the upper face 1451 of the barrier 145 meets an outer lateral face 1452 of the barrier 145 facing the second reflective layer part 1441, among all those corners where the upper face 1451 meets lateral faces of the barrier 145, it is desirable that the upper face 1451 of the barrier 145 is entirely covered with the encapsulating member 12. Particularly, when the upper face 1451 of the barrier 145 is at right angles to the outer lateral face 1452 of the barrier 145, the surface tension effects that are created between the encapsulating member 12 and the upper face 1451 of the barrier 145 are maximized. To make the upper face 1541 and outer lateral face 1452 of the barrier 145 be at right angles 1453, it is desirable to use a metal and to deposit the metal to form the barrier 145. For better understanding, the upper and outer lateral faces 1451 and 1452 of the barrier 145 are shown in a magnified dotted circle. Here, the outer lateral face 1452 of the barrier 145 is not covered with the encapsulating member 12.

Preferably, the barrier 145 has a height less than a height the semiconductor light emitting device chip 10 and equal to heights of the conductive and reflective layers 142 and 144, but it is not limited thereto. For instance, the height of the barrier 145 may be less or greater than the heights of the conductive and reflective layers 142 and 144. A view angle of light coming out of the semiconductor light emitting device 1 in the case where the height of the barrier 145 is not greater the height of the conductive layer 142 is broader than that of the case where the height of the barrier 145 is greater than the height of the conductive layer 142. For instance, the barrier 145 can be formed at a height of 0.05 mm or less.

Preferably, the barrier 145 has a width less than widths of the conductive and reflective layers 142 and 144, and less than a separation gap between the barrier 145 and the second reflective layer part 1441 of the reflective layer 144, but it is not limited thereto. Alternatively, the width of the barrier 145 may be equal to or greater than the separation gap between the barrier 145 and the second reflective layer part 1441 of the reflective layer 144. For instance, the barrier 145 can be formed at a width of 0.1 mm or less.

The external substrate 14 can further include a heat emission pad (not shown) on the lower face of the base 141. The heat emission pad facilitates heat emission from the external substrate 14 to outside. A method of manufacturing the semiconductor light emitting device in FIG. 18 is described in FIG. 21.

FIG. 19 shows an example of a semiconductor light emitting device 8 according to one aspect of the present disclosure.

The semiconductor light emitting device 8 is substantially the same as the semiconductor light emitting device 1 shown in FIG. 18, except that a reflective layer 844 of the semiconductor light emitting device 8 has only a first reflective layer part 844 without a second reflective layer part.

FIG. 20 shows an example of a semiconductor light emitting device 6 according to one aspect of the present disclosure.

Figure 20A:
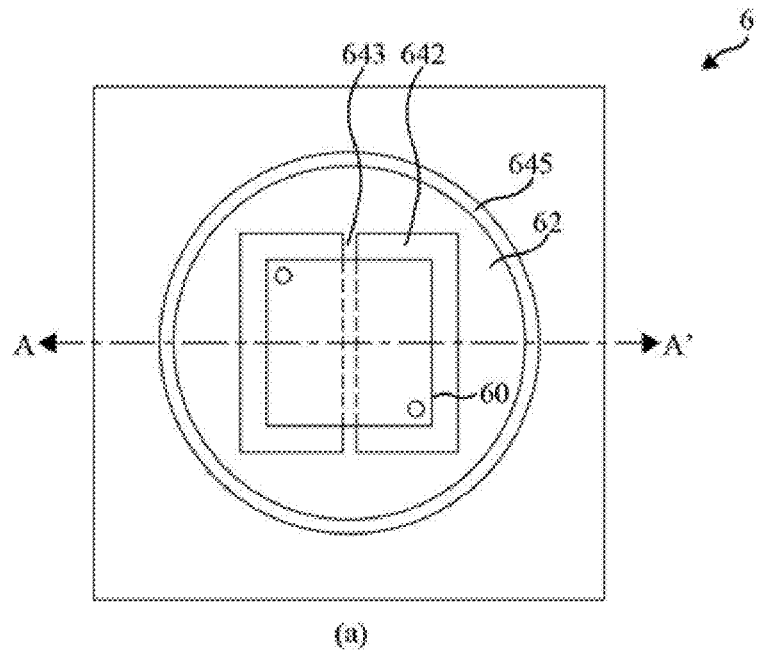
FIGS. 20A and 20B shows an example of a semiconductor light emitting device according to one aspect of the present disclosure.
Figure 20B:
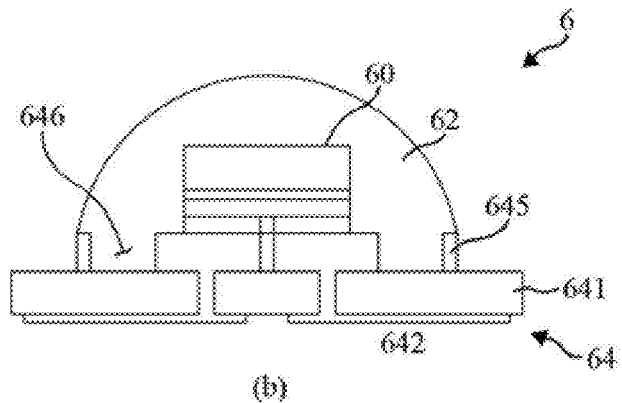

FIG. 20(A) is a top view, and FIG. 20(B) is a cross sectional view taken along AA'.

The semiconductor light emitting device 6 includes an external substrate 64, a semiconductor light emitting device chip 60, and an encapsulating member 62. It does not include a reflective layer. Although not shown, a second reflective layer part can be formed. To allow the encapsulating member 62 to have a minimum flat area, a barrier 645 is formed at a distance of 200 μm or less from conductive layers 642. While forming the encapsulating member 62 over the conductive layer 642 may be one way to minimize the flat area of the encapsulating member 62, the conductive layer 642 has an open portion 643 between the conductive layers 642 to prevent an electrical short. This open portion 643 can be filled with an insulating material. However, even after the insulating material is filled in the open portion 643 of the encapsulating member 62, the presence of the open portion 643 causes the encapsulating member 62 to run over the conductive layers 642 as surface tension that occurs between the lower face of the encapsulating member 62 and the upper face of the conductive layers 642 is not strong enough to keep and limit the lens-shaped encapsulating member 62 to only the upper face of the conductive layers 642, making this filling option less desirable. To resolve this, the barrier 645 in a closed loop form without any open section within a 200 μm distance from the conductive layers 642 is protruded from the upper face of the base 641. Particularly, since there is no reflective layer between the conductive layer 642 and the barrier 645, a groove 646 may be formed such that the barrier 645 can serve as a dam like a wall when the encapsulating member 62 is formed. In this embodiment, however, the barrier 645 has a height equal to or lower than a height of the conductive layers 642, i.e., the barrier 645 is not high enough to work as a dam like a wall. Nevertheless, as described in FIG. 18, the barrier 645 will suffice for serving as a dam at least, with the help of surface tension occurring between the upper face of the barrier 645 and the lower face of the encapsulating member 62, for preventing the encapsulating member 62 from running over the barrier 143. While the barrier 645 illustrated in FIG. 20 has a closed loop shape, it may adopt other shapes including a circle or a square, if needed. Additionally, the barrier 645 and the conductive layers 642 can be formed together as they both are made of conductive metallic substances. The base 641 is preferably made of an insulating substance to allow the conductive layers 642 and the barrier 645 to be formed with conductive metallic substances. In particular, since the barrier 645 is formed into a close loop shape, it is desirable that the base 641 should be made of an insulating substance in order to prevent an electrical short. Moreover, a metallic substance is preferred to a resin for the barrier 645 in order to maximize the surface tension between the barrier 645 and the encapsulating member 62 made of a light-transmitting resin. Although not shown, if the second reflective layer part (if available) is made of a metallic substance identical with those of the barrier and conductive layers, these three layers can be formed at once. With the exception of not having a reflective layer, the semiconductor light emitting device 6 is substantially the same as the semiconductor light emitting device 1 described in FIG. 18.

FIG. 21 shows an example of a method of manufacturing the semiconductor light emitting device described in FIG. 18.

Figure 21A:
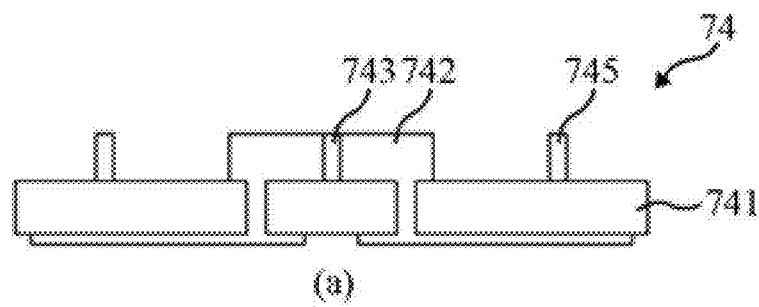
FIGS. 21A, 21B, 21C and 21D shows an example of a method of manufacturing the semiconductor light emitting device described in FIGS. 18A and 18B.

Referring to FIG. 21(A), in this method of manufacturing the semiconductor light emitting device, an external substrate 74 with a partially exposed upper face is first prepared. The external substrate 74 includes a base 741, conductive layers 742, an insulating layer 743, and a barrier 745. The barrier 745 and the conductive layers 742 may be formed either together at once or through separate processes. Here, the insulating layer 743 may be omitted. In order to form the barrier 745, the base 741 is grooved by laser machining, and a seed metal is deposited with the help of a sputter. Next, in order to form the conductive layers 742, a dry photoresist film is patterned and then plated. While the conductive layers 742 are formed by plating, the barrier 745 can be formed together at the same time.

As can be seen in the external substrate 74, a plurality of conductive layers 742 is formed on the base 741, the insulating layer 743 is arranged between the plurality of conductive layers 742, and the upper face of the base 741 is exposed around the barrier 745. This exposed upper face portion of the base 741 are where a reflective layer 744 is going to be formed.

Figure 21B:
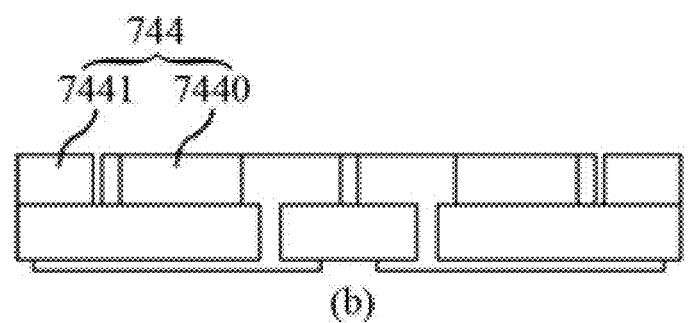

Referring now to FIG. 21(B), the reflective layer 744 made of a reflective substance is formed on the exposed portion of the base 741. The reflective layer 744 includes a first reflective layer part 7440 which is arranged facing the lower face of the encapsulating member 72, and a second reflective layer part 7441 which is separated by the barrier 72 from the first reflective layer part 7440 and is not covered with the encapsulating member 72.

The first reflective layer part 7440 and the second reflective layer part 7441 can be formed using the same substance and at the same time, but they are not limited thereto.

For example, in case that the semiconductor light emitting device chip 70 is an ultraviolet-light emitting device chip, the first reflective layer part 7440 placed on the lateral face of the semiconductor light emitting device chip 70 can be made of white silicon that resists to discoloration caused by the ultraviolet light and retains high reflectivity and insulation properties, while the second reflective layer part 7441 placed at a predefined distance from the first reflective layer part 7440 and from the semiconductor light emitting device chip 70 and thus less sensitive to ultraviolet light than the first reflective layer part 7440 can be made of a metallic substance, such as Ag or Al.

Figure 21C:
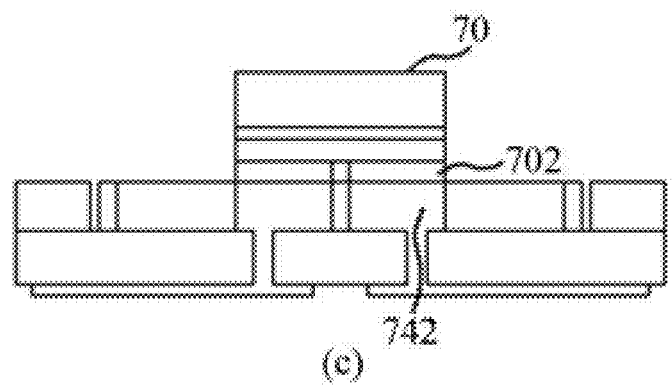

Next, as shown in FIG. 21(C), electrodes 702 of the semiconductor light emitting device chip 70 are mounted on the external substrate 74 such that they are electrically connected to the conductive layers 742 of the external substrate 74. While the semiconductor light emitting device chip 70 in this embodiment is a flip chip, it may be, without limitation, a lateral chip or a vertical chip.

Figure 21D:
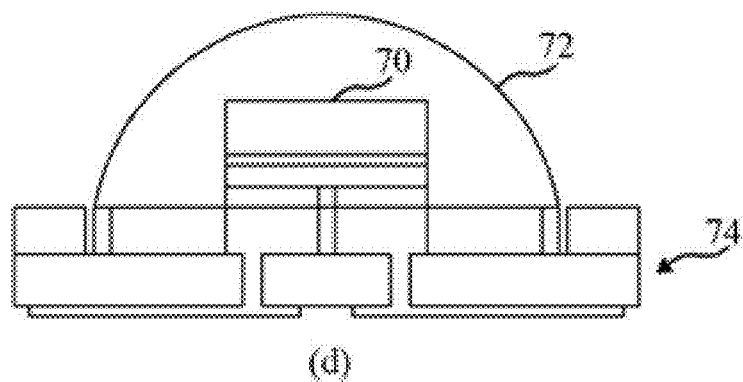

Referring to FIG. 21(D), the encapsulating member 72 surrounds the semiconductor light emitting device chip 70. The encapsulating member 72 can have a convex hemispherical lens shape, but it is not limited thereto.

The encapsulating member 72 does not run over the barrier 745 because of surface tension created between the encapsulating member 72 and the barrier 745 during the formation of the encapsulating member 12.

The encapsulating member 72 is cured to couple the semiconductor light emitting device chip 70 and the external substrate 74 together in one body. Heat treatment and/or drying operations for curing the encapsulating member 72 can be carried out at a temperature, for example, between 102° C. and 170° C. for about 1 to 5 hours. Although these temperature and time period ranges for the heat treatment and/or drying operations are set to cause the encapsulating member 72 to have an even surface and uniform thickness, to prevent the formation of bubbles inside of the encapsulating member 72, and to define or establish a stable bonding to the semiconductor light emitting device chip 70 and to the external substrate 74, they are not limited thereto. If a substance that undergoes a significant volume change during a curing operation is used for forming the encapsulating member 72, the preliminary encapsulating member described in FIG. 12 may be used in a process of forming the encapsulating member 72. The steps mentioned in those methods of manufacturing semiconductor light emitting devices according to the present disclosure may be performed in any order within the scope that can be easily modified by a person in the art, and the order is also included in the present disclosure.

Figure 22A:
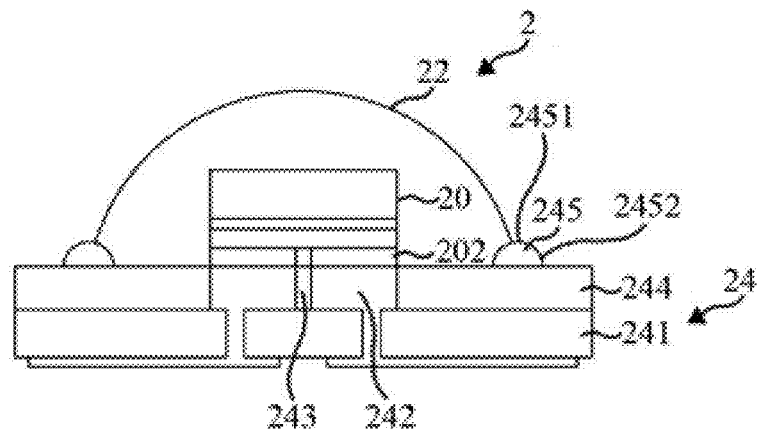
FIGS. 22A and 22B shows an example of a semiconductor light emitting device according to one aspect of the present disclosure.
Figure 22B:
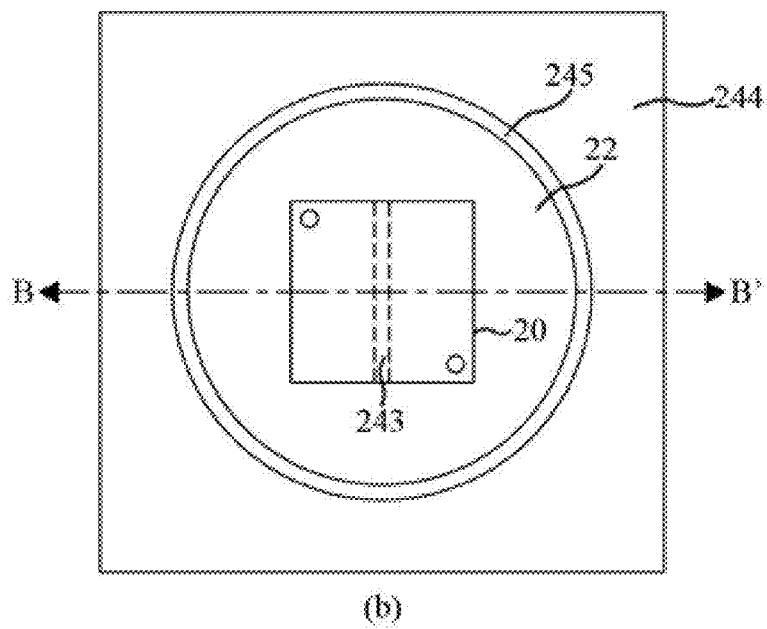

FIG. 22 shows an example of a semiconductor light emitting device 2 according to one aspect of the present disclosure, in which FIG. 22(A) is a cross sectional view taken along BB', and FIG. 22(B) is a top view.

With the exception of an external substrate 24, the semiconductor light emitting device 6 in FIG. 22 is substantially the same as the semiconductor light emitting device 1 described in FIG. 18.

The external substrate 24 of the semiconductor light emitting device 2 includes a base 241, conductive layers 242, an insulating layer 243, a reflective layer 244, and a barrier 245.

The reflective layer 244 made of a reflective substance is arranged on the entire upper face of the base 241. Examples of the substance and method of forming the reflective layer 244 preferably follow those of the reflective layer 144 shown in FIG. 18, are not limited thereto. However, to prevent an electrical short with the conductive layers 242, the reflective layer 244 is preferably made of insulating white silicon.

Among the light from the semiconductor light emitting device chip 20, a portion of the light directed towards the external substrate 24 is reflected by the reflective layer 244 formed all over the upper face of the base 241 and emitted outside the device.

The barrier 245 is formed on the upper face of the reflective layer 244. The barrier 245 can be used as a stopper wall, i.e. a dam, for keeping the encapsulating member 22 from running over the barrier 245 when the encapsulating member 22 is formed. Alternatively, the barrier 245 can be omitted. While the barrier 245 in this embodiment has a hemispherical convex shape, it may have, without limitation, a planar, conical, concave or geometrical-structured upper face.

The barrier 245 is preferably made of a material, which not only is sufficiently firm or hard to maintain the shape of the encapsulating member 22 protecting the semiconductor light emitting device chip 20, but which is also effective for avoiding cracks or splits.

Alternatively, the barrier 245 can be made of a colored reflective substance that reflects light from the semiconductor light emitting device chip 20 towards the encapsulating member 22, but it is not limited thereto.

Although the barrier 245 serves as a dam, it does not mean that it serves as a wall that stops the overflow of a resin of the encapsulating member 22. Rather, the encapsulating member 22 does not run over the barrier 245 because of surface tension created between the upper face of the barrier 245 and the lower face of the encapsulating member 22 when the encapsulating member 22 is formed. Thus, the encapsulating member 22 can be adapted to cover all or only a part of the upper face of the barrier 245. Because the effects of surface tension that are created between the encapsulating member 22 and an upper face 2451 of the barrier 245 are maximized on the edge of an outer lateral face 2452 opposite to the conductive layers 242, among the upper face 2451 and lateral faces of the barrier 245, it is desirable that the upper face 2451 of the barrier 245 is entirely covered with the encapsulating member 22. Here, the outer lateral face 2452 of the barrier 245 is not covered with the encapsulating member 22. With the barrier 245 having a reduced height because of its capability of serving as a dam using the surface tension, the lens shape of the encapsulating member 22 is retained without being distorted and can reach its desired shape as close as possible.

Preferably, the barrier 245 has a height less than a height the semiconductor light emitting device chip 20 and equal to a height of the electrode 202 of the semiconductor light emitting device chip 20, but it is not limited thereto. For instance, the height of the barrier 245 may be less or greater than the height of the electrode 202 of the semiconductor light emitting device chip 20. With the exception of the configurational features described above referring to FIG. 22, the semiconductor light emitting device 2 is substantially the same as the semiconductor light emitting device 1 of FIG. 18. A method of manufacturing the semiconductor light emitting device in FIG. 22 is described in FIG. 24.

FIG. 23 shows an example of a method of manufacturing the semiconductor light emitting device described in FIG. 22.

Figure 23A:
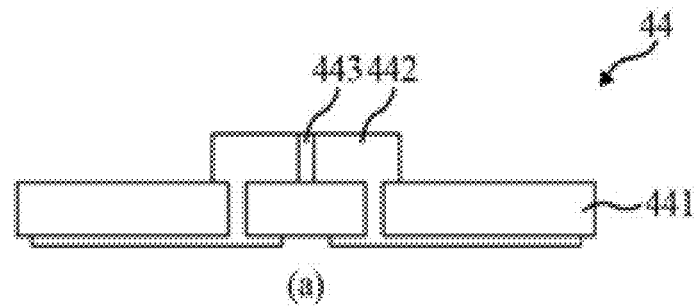
FIGS. 23A, 23B, 23C, 23D and 23E shows an example of a method of manufacturing the semiconductor light emitting device described in FIGS. 22A and 22B.

As shown in FIG. 23(A), an external substrate 44 having a partially exposed upper face is first prepared. The external substrate 44 includes a base 441, conductive layers 442, and an insulating layer 443. The insulating layer 443 can be omitted. A portion of the base 441 is exposed, where the reflective layer 444 is to be formed.

Figure 23B:
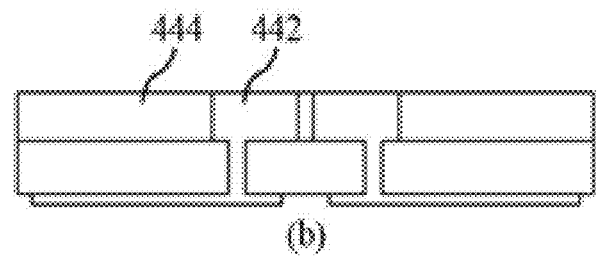

Referring now to FIG. 23(B), a reflective substance is applied to the exposed portion of the base 441 to form the reflective layer 444. Preferably, the reflective layer 444 is formed as thick as the insulating layer 442.

Figure 23C:
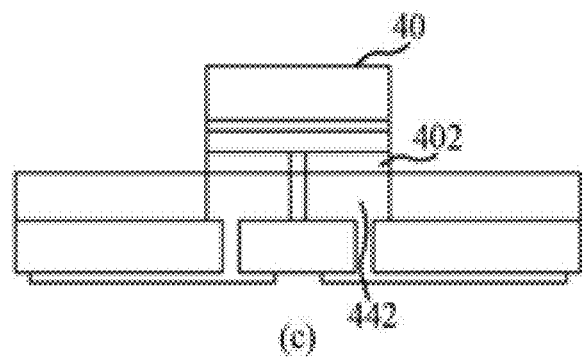

Next, as shown in FIG. 23(C), electrodes 402 of the semiconductor light emitting device chip 40 are mounted on the external substrate 44 such that they are electrically connected to the conductive layers 442 of the external substrate 44. While the semiconductor light emitting device chip 40 in this embodiment is a flip chip, it may be, without limitation, a lateral chip or a vertical chip.

Figure 23D:
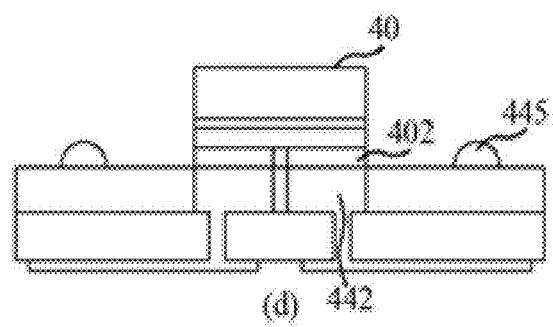

Referring to FIG. 23(D), a barrier 445 is formed on the reflective layer 444.

In this embodiment, after the semiconductor light emitting device chip 40 is mounted on the external substrate 44, the barrier 445 is then formed on the reflective layer 444. Alternatively however, it is possible that after the barrier 445 is formed on the reflective layer 444, the semiconductor light emitting device chip 40 is mounted on the external substrate 44.

Figure 23E:
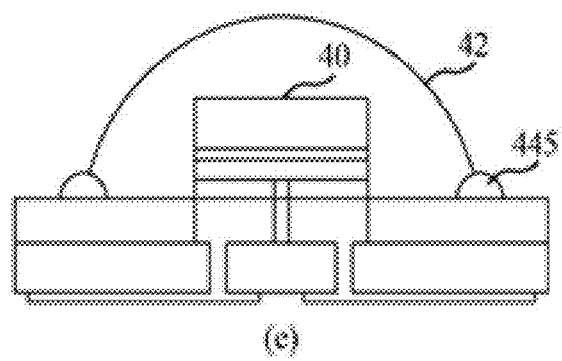

Further, as shown in FIG. 23(E), an encapsulating member 42 is formed to surround the semiconductor light emitting device chip 40. The encapsulating member 42 can have a hemispherical convex lens shape, but it is not limited thereto. The encapsulating member 42 does not run over the barrier 445 due to surface tension that is created between the encapsulating member 42 and the barrier 445 when the encapsulating member 42 is formed.

Figure 24:
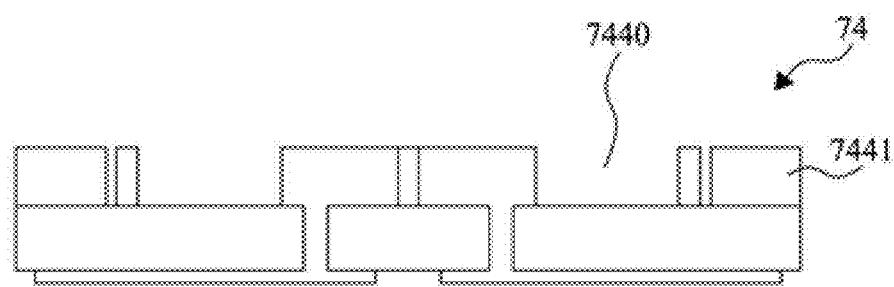
FIG. 24 shows an example of a method of manufacturing semiconductor light emitting devices according to one aspect of the present disclosure.

FIG. 24 shows an example of a method of manufacturing semiconductor light emitting devices according to one aspect of the present disclosure.

An external substrate 74 can include a second reflective layer part 7441 only. A portion of a base 741 is exposed, where a first reflective layer part 7440 is to be formed. The other processes are substantially the same as those described in FIG. 21.

The steps mentioned in those methods of manufacturing semiconductor light emitting devices according to the present disclosure may be performed in any order within the scope that can be easily modified by a person in the art, and the order is also included in the present disclosure.

Set out below are clauses that describe diverse features of further aspects of the present disclosure.

(1) A semiconductor light emitting device comprising: a semiconductor light emitting device chip which includes a plurality of semiconductor layers, and electrodes electrically connected to the plurality of semiconductor layers, the plurality of semiconductor layers including an active layer adapted to generate ultraviolet light by recombination of electrons and holes; an encapsulating member adapted to surround the semiconductor light emitting device chip; and an external substrate including a base, and conductive layers electrically connected to the electrodes of the semiconductor light emitting device chip, wherein a flat area portion of the external substrate that is in contact with a lower face of the encapsulating member is smaller than a flat area portion of the external substrate that is not in contact with the lower face of the encapsulating member.

(2) There is also provided, the semiconductor light emitting device of clause (1) wherein the conductive layer is arranged inside of the encapsulating member and adapted to reflect the ultraviolet light, the conductive layer having one face made of a substance with UV reflectivity of less than 90%.

(3) There is also provided, the semiconductor light emitting device of clause (1) wherein the conductive layer is arranged inside of the encapsulating member and adapted to reflect the ultraviolet light, the conductive layer having one face made of a substance with UV reflectivity of 40% or less.

(4) There is also provided, the semiconductor light emitting device of clause (1) wherein the conductive layer is arranged inside of the encapsulating member and adapted to reflect the ultraviolet light, the conductive layer having one face made of Au.

(5) There is also provided, the semiconductor light emitting device of clause (1) wherein the external substrate includes a barrier with a closed loop shape placed at a predefined distance from the conductive layer, the barrier having an upper face in contact with the lower face of the encapsulating member.

(6) There is also provided, the semiconductor light emitting device of clause (5) wherein the barrier is arranged inside of the encapsulating member and adapted to reflect the ultraviolet light, the barrier having one face made of a substance with UV reflectivity of 40% or less.

(7) There is also provided, the semiconductor light emitting device of clause (1) wherein the conductive layer and the barrier are arranged inside of the encapsulating member and adapted to reflect the ultraviolet light, the conductive layer and the barrier each having one face made of same metallic substances.

(8) There is also provided, the semiconductor light emitting device of clause (1) wherein the encapsulating member is made of a thermoplastic resin having at least 80% UV transmissivity.

(9) There is also provided, the semiconductor light emitting device of clause (8) wherein the thermoplastic resin undergoes a reduction in volume of at least 90% during a heat-curing process for solidifying the thermoplastic resin in liquid phase.

(10) There is also provided, the semiconductor light emitting device of clause (1) wherein the encapsulating member has a hemispherical lens shape.

(11) There is also provided, the semiconductor light emitting device of clause (1) wherein the semiconductor light emitting device chip is a flip chip that emits UV-C, wherein the encapsulating member is made of a thermoplastic resin having at least 80% UV transmissivity, wherein an upper part of the conductive layer is made of a substance having UV-C reflectivity of lower than 90%, and wherein the electrodes of the semiconductor light emitting device chip are electrically connected to the upper part of the conductive layer.

(12) A method of manufacturing a preliminary encapsulating member for use in a semiconductor light emitting device including a semiconductor light emitting device chip, the method comprising: placing dummy semiconductor light emitting device chips on a first base layer; forming a preliminary encapsulating member substrate on a second base layer; placing the dummy semiconductor light emitting device chips to face the preliminary encapsulating member substrate arranged on the second base layer; compressing the preliminary encapsulating member substrate by the dummy semiconductor light emitting device chips to form a preliminary encapsulating member with a plurality of grooves; and scribing the substrate along a scribe line to separate and obtain individual preliminary encapsulating members.

(13) There is also provided, the method of manufacturing a preliminary encapsulating member for use in a semiconductor light emitting device of clause (12) wherein the preliminary encapsulating member substrate is made of a light-transmitting thermoplastic resin having at least 90% transmissivity for light of a wavelength band ranging from 100 nm to 400 nm.

(14) There is also provided, the method of manufacturing a preliminary encapsulating member for use in a semiconductor light emitting device of clause (12) wherein the preliminary encapsulating member substrate is made of a solid light-transmitting thermoplastic resin having at least 90% transmissivity for light of a wavelength band ranging from 100 nm to 400 nm obtained by curing a liquid-phase light-transmitting thermoplastic resin having at least 90% transmissivity for light of a wavelength band ranging from 100 nm to 400 nm.

(15) There is also provided, the method of manufacturing a preliminary encapsulating member for use in a semiconductor light emitting device of clause (12) wherein the liquid-phase light-transmitting thermoplastic resin undergoes a reduction in volume of at least 90% during the curing process.

(16) There is also provided, the method of manufacturing a preliminary encapsulating member for use in a semiconductor light emitting device of clause (12) wherein the second base layer is a hot plate.
(17) There is also provided, the method of manufacturing a preliminary encapsulating member for use in a semiconductor light emitting device of clause (12) wherein placing dummy semiconductor light emitting device chips on a first base layer involves forming metal layers at regular intervals on the first base layer, and arranging dummy semiconductor light emitting device chips on the metal layers, respectively.
(18) There is also provided, the method of manufacturing a preliminary encapsulating member for use in a semiconductor light emitting device of clause (12) wherein the preliminary encapsulating member includes a body with a groove, and a supporting part connected to a lateral face of the body, the supporting part having a height greater than a height of the semiconductor light emitting device chips included in the semiconductor light emitting device.
(19) There is also provided, the method of manufacturing a preliminary encapsulating member for use in a semiconductor light emitting device of clause (12) wherein the groove of the preliminary encapsulating member is shaped correspondingly to the semiconductor light emitting device chip included in the semiconductor light emitting device.
(20) There is also provided, the method of manufacturing a preliminary encapsulating member for use in a semiconductor light emitting device of clause (12) wherein each of the grooves of the preliminary encapsulating member has a width greater than a width of the semiconductor light emitting device chips included in the semiconductor light emitting device.
(21) There is also provided, the method of manufacturing a preliminary encapsulating member for use in a semiconductor light emitting device of clause (12) wherein compressing the preliminary encapsulating member substrate by the dummy semiconductor light emitting device chips to form a preliminary encapsulating member with a plurality of grooves involves compressing the preliminary encapsulating member substrate in a flexible state by the dummy semiconductor light emitting device chips.
(22) A method of manufacturing semiconductor light emitting devices, the method comprising: preparing an external substrate having conductive layers; placing, over the external substrate, a semiconductor light emitting device chip which includes a plurality of semiconductor layers and electrodes electrically connected to the plurality of semiconductor layers, the plurality of semiconductor layers including an active layer adapted to generate light by recombination of electrons and holes, in such a way that the conductive layers of the external substrate are electrically connected to the electrodes of the semiconductor light emitting device chip; arranging an preliminary encapsulating member made of a light-transmitting thermoplastic resin over the semiconductor light emitting device chip; and heat-curing the preliminary encapsulating member to form an encapsulating member that surrounds the semiconductor light emitting device chip.
(23) There is also provided, the method of manufacturing semiconductor light emitting devices of clause (22) wherein the preliminary encapsulating member is made of a solid preliminary encapsulating member obtained by curing a liquid-phase light-transmitting thermoplastic resin having at least 90% transmissivity for light of a wavelength band ranging from 100 nm to 400 nm.
(24) There is also provided, the method of manufacturing semiconductor light emitting devices of clause (22) wherein the liquid-phase light-transmitting thermoplastic resin undergoes a reduction in volume of at least 90% during the curing process.
(25) There is also provided, the method of manufacturing semiconductor light emitting devices of clause (22) further comprising: prior to arranging an preliminary encapsulating member made of a light-transmitting thermoplastic resin over the semiconductor light emitting device chip, forming a liquid-phase light-transmitting thermoplastic resin layer having at least 90% transmissivity for light of a wavelength band ranging from 100 nm to 400 nm over the external substrate to surround the semiconductor light emitting device chip; and heat-curing the liquid-phase resin layer to form an encapsulating material layer.
(26) There is also provided, the method of manufacturing semiconductor light emitting devices of clause (22) wherein the encapsulating material layer is obtained after the liquid-phase resin layer undergoes a reduction in volume of at least 90% by the curing process.
(27) There is also provided, the method of manufacturing semiconductor light emitting devices of clause (22) wherein the preliminary encapsulating member comprises a body with a groove, and a supporting part connected to a lateral face of the body.
(28) There is also provided, the method of manufacturing semiconductor light emitting devices of clause (22) wherein arranging an preliminary encapsulating member made of a light-transmitting thermoplastic resin over the semiconductor light emitting device chip involves putting the semiconductor light emitting device chip into a groove of the preliminary encapsulating member.
(29) There is also provided, the method of manufacturing semiconductor light emitting devices of clause (22) wherein the external substrate includes a barrier, and wherein heat-curing the preliminary encapsulating member to form an encapsulating member that surrounds the semiconductor light emitting device chip involves forming the encapsulating member in a way that at least a portion of an upper face of the barrier of the external substrate is covered.
(30) There is also provided, the method of manufacturing semiconductor light emitting devices of clause (22) wherein the encapsulating member is formed in a way that the upper face of the barrier of the external substrate is entirely covered.
(31) There is also provided, the method of manufacturing semiconductor light emitting devices of clause (22) wherein the barrier has a height equal to or greater than a height of the conductive layer.
(32) There is also provided, the method of manufacturing semiconductor light emitting devices of clause (22) wherein heat-curing the preliminary encapsulating member to form an encapsulating member that surrounds the semiconductor light emitting device chip involves forming the encapsulating member in a way that all faces of the encapsulating member except for a portion of the lower face thereof in contact with the external substrate are covered.
(33) There is also provided, the method of manufacturing semiconductor light emitting devices of clause (22) wherein the external substrate includes a reflective layer placed at a predefined distance from the barrier on the upper face of the external substrate, and wherein heat-curing the preliminary encapsulating member to form an encapsulating member that surrounds the semiconductor light emitting device chip involves forming the encapsulating member in a way that one of lateral faces of the barrier located between the reflective layer and the barrier is not covered with the encapsulating member.
(34) There is also provided, the method of manufacturing semiconductor light emitting devices of clause (22) wherein heat-curing the preliminary encapsulating member to form an encapsulating member that surrounds the semiconductor light emitting device chip involves forming the encapsulating member into at least one of a hemispherical convex lens, concave lens, flat-top lens, meniscus lens, conical lens or different geographical structure lens shape.
(35) A semiconductor light emitting device comprising: a semiconductor light emitting device chip including a plurality of semiconductor layers, and electrodes electrically connected to the plurality of semiconductor layers, the plurality of semiconductor layers including an active layer adapted to generate light by recombination of electrons and holes; an encapsulating member of a lens shape made of a light-transmitting thermoplastic resin having at least 90% transmissivity for light of a wavelength band ranging from 100 nm to 400 nm, for surrounding the semiconductor light emitting device chip; and an external substrate including conductive layers electrically connected to the electrodes of the semiconductor light emitting device chip, wherein the encapsulating member is formed in a way that all faces of the encapsulating member are exposed to outside, except for a portion of the lower face thereof in contact with the external substrate.
(36) There is also provided, the semiconductor light emitting device of clause (35) wherein the external substrate includes a barrier arranged farther from the semiconductor light emitting device chip than the conductive layers are, and wherein the encapsulating member covers at least a portion of the upper face of the barrier.
(37) There is also provided, the semiconductor light emitting device of clause (35) wherein the encapsulating member entirely covers the upper face of the barrier.
(38) There is also provided, the semiconductor light emitting device of clause (35) wherein the barrier has a height equal to or less than a height of the conductive layers.
(39) There is also provided, the semiconductor light emitting device of clause (35) wherein the external substrate includes a reflective layer placed at a predefined distance from the barrier on the upper face of the external substrate.
(40) There is also provided, the semiconductor light emitting device of clause (35) wherein one of lateral faces of the barrier located between the reflective layer and the barrier is not covered with the encapsulating member.
(41) There is also provided, the semiconductor light emitting device of clause (35) wherein the barrier is made of a metallic substance comprising Au or Al.
(42) There is also provided, the semiconductor light emitting device of clause (35) wherein the barrier has a closed loop form without a slit.
(43) There is also provided, the semiconductor light emitting device of clause (35) wherein the semiconductor light emitting device chip emits light with a wavelength band ranging from 100 nm to 400 nm.
(44) There is also provided, the semiconductor light emitting device of clause (35) wherein the encapsulating member is formed into at least one of a hemispherical convex lens, concave lens, flat-top lens, meniscus lens, conical lens or different geographical structure lens shape.
(45) A semiconductor light emitting device comprising: a semiconductor light emitting device chip which includes a plurality of semiconductor layers, and electrodes electrically connected to the plurality of semiconductor layers, the plurality of semiconductor layers including an active layer adapted to generate ultraviolet light by recombination of electrons and holes; an encapsulating member adapted to surround the semiconductor light emitting device chip; and an external substrate including a base made of an insulating substance, a barrier, and conductive layers electrically connected to the electrodes of the semiconductor light emitting device chip, wherein an upper face of the barrier is in contact with a lower face of the encapsulating member.
(46) There is also provided, the semiconductor light emitting device of clause (45) wherein the barrier is made of the same substance as the conductive layers.
(47) There is also provided, the semiconductor light emitting device of clause (45) wherein the upper face and outer lateral face of the barrier are at right angles.
(48) There is also provided, the semiconductor light emitting device of clause (45) further comprising: a metallic reflective layer placed at a predefined distance from the barrier, in the direction of an outer lateral face of the barrier.
(49) There is also provided, the semiconductor light emitting device of clause (45) wherein the metallic reflective layer is made of Al.
(50) A method of manufacturing semiconductor light emitting devices, the method comprising: preparing a base made of an insulating substance; forming a conductive layer and a barrier on one face of the base, the barrier being placed at a predefined distance from the conductive layer and protruded in a closed loop form from an upper face of the base; electrically connecting electrodes of a semiconductor light emitting device chip to the conductive layer; and forming an encapsulating member for surrounding the semiconductor light emitting device chip, the encapsulating member being adapted to entirely cover the upper face of the barrier, except for an outer lateral face of the same.
(51) There is also provided, the method of manufacturing semiconductor light emitting devices of clause (50) further comprising: after forming a conductive layer and a barrier on one face of the base, forming a metallic reflective layer at a predefined distance from the barrier, in the direction of an outer lateral face of the barrier, the metallic reflective layer having a height equal to or less than a height of the barrier.
(52) A semiconductor light emitting device comprising: a semiconductor light emitting device chip which includes a plurality of semiconductor layers, and electrodes electrically connected to the plurality of semiconductor layers, the plurality of semiconductor layers including an active layer adapted to generate ultraviolet light by recombination of electrons and holes; an encapsulating member adapted to surround the semiconductor light emitting device chip; and an external substrate including a base, and conductive layers electrically connected to the electrodes of the semiconductor light emitting device chip, wherein if the semiconductor light emitting device chip has a flat area between 0.8 mm² and 1.5 mm², a ratio of a total area of the conductive layer to an exposed area of the conductive layer is 45% or less, and if the semiconductor light emitting device chip has a flat area between 0.06 mm² and 0.3 mm², a ratio of a total area of the conductive layer to an exposed area of the conductive layer is 85% or less.

(53) There is also provided, the semiconductor light emitting device of clause (52) wherein if the semiconductor light emitting device chip has a flat area between 0.8 mm² and 1.5 mm², a ratio of a total area of the conductive layer to an exposed area of the conductive layer is 35% or greater, and if the semiconductor light emitting device chip has a flat area between 0.06 mm² and 0.3 mm², a ratio of a total area of the conductive layer to an exposed area of the conductive layer is 70% or greater.

(54) A semiconductor light emitting device comprising: a semiconductor light emitting device chip which includes a plurality of semiconductor layers, and electrodes electrically connected to the plurality of semiconductor layers, the plurality of semiconductor layers including an active layer adapted to generate ultraviolet light by recombination of electrons and holes; an encapsulating member adapted to surround the semiconductor light emitting device chip; and an external substrate including a base, and conductive layers electrically connected to the electrodes of the semiconductor light emitting device chip, wherein one face of the conductive layer placed inside of the encapsulating member and adapted to reflect ultraviolet light is made of a substance having less than 90% reflectivity for ultraviolet light, and wherein diameter of a lower face of the encapsulating member is smaller than diameter of the same when a difference in $\Delta P_o$ value between the conductive layer made of a substance having less than 90% reflectivity for ultraviolet light and a conductive layer made of a substance having at least 90% reflectivity for ultraviolet light falls within 5%.

(55) There is also provided, the semiconductor light emitting device of clause (54) wherein the diameter of the lower face of the encapsulating member is smaller than diameter of the same when the $\Delta P_o$ value is 50% or greater.

(56) A semiconductor light emitting device comprising: a semiconductor light emitting device chip which includes a plurality of semiconductor layers, and electrodes electrically connected to the plurality of semiconductor layers, the plurality of semiconductor layers including an active layer adapted to generate ultraviolet light by recombination of electrons and holes; an encapsulating member adapted to surround the semiconductor light emitting device chip; and an external substrate including a base, and conductive layers electrically connected to the electrodes of the semiconductor light emitting device chip, wherein an exposed area of the conductive layer not being covered with the semiconductor light emitting device chip is no larger than 1 mm² out of a total area of the conductive layer.

(57) There is also provided, the semiconductor light emitting device of clause (56) wherein an exposed area of the conductive layer not being covered with the semiconductor light emitting device chip is no smaller than 0.45 mm² out of a total area of the conductive layer.

(58) A method of manufacturing semiconductor light emitting devices, the method comprising: preparing an external substrate including a base, conductive layers, and a barrier; forming a reflective layer on an exposed portion of the base, the reflective layer having a height equal to or greater than a height of the conductive layers; electrically connecting electrodes of a semiconductor light emitting device chip to the conductive layers of the external substrate; and forming an encapsulating member for surrounding the semiconductor light emitting device chip, the encapsulating member being adapted to entirely cover the upper face of the barrier, except for an outer lateral face of the same.

A semiconductor light emitting device according to the present disclosure has high ultraviolet extraction efficiency and excellent bonding strength between a semiconductor light emitting device chip and a conductive layer.

A semiconductor light emitting device according to the present disclosure has a reflective layer formed on the upper face of an external substrate for a semiconductor light emitting device chip to be mounted, in which the reflective layer made of Al or white silicon, compared with a reflective layer made of Ag, resists to discoloration caused by ultraviolet light emitted from the semiconductor light emitting device chip and retains a high reflectivity. As a result, the reliability as well as light extraction efficiency of the semiconductor light emitting device can be improved.

A semiconductor light emitting device according to the present disclosure includes a barrier on an external substrate, in which the barrier is adapted to prevent an encapsulating member from running over during the curing process.

A semiconductor light emitting device according to the present disclosure can have a $\Delta P_o$ value of 50% or greater by an adjusted diameter of an encapsulating member even when ultraviolet reflecting faces of an external substrate (e.g. upper faces of the conductive layers and barrier) inside of the encapsulating member are made of substances having UV reflectivity of 90% or less. Moreover, a semiconductor light emitting device according to the present disclosure can still maintain a difference in $\Delta P_o$ value of less than 5% between ultraviolet reflecting faces of the external substrate (e.g. upper faces of the conductive layers and barrier) inside of the encapsulating member that are made of substances having UV reflectivity of 90% or less and ultraviolet reflecting faces of the external substrate inside of the encapsulating member that are made of substances having UV reflectivity of at least 90%.

A semiconductor short-wavelength UVC light emitting device according to the present disclosure has an ultraviolet reflecting face inside of the encapsulating member. While the ultraviolet reflecting face is preferably made of a substance with high reflectivity (e.g. Al) for ultraviolet light, those substances highly reflective for ultraviolet light do not necessarily have excellent bonding strength to the electrodes of a semiconductor light emitting device chip in a soldering or eutectic bonding process. On the other hand, other substances with excellent bonding strength suitable for soldering or eutectic bonding to the electrodes of a semiconductor light emitting device chip do not necessarily have high reflectivity for ultraviolet light. With a reduction in diameter size of the lower face of the encapsulating member, the inventors learned that a substance having poor UV reflectivity yet exhibiting excellent bonding strength to the electrodes of a semiconductor light emitting device chip during soldering or eutectic bonding can still present an excellent light extraction efficiency similar to one available from a substance with high UV reflectivity. Such adjustment in diameter size of the lower face of the encapsulating member can be facilitated by incorporating a barrier structure. Meanwhile, a UV degradation-resistant thermoplastic resin generally used for making a lens form of desired shape through the adjustment in diameter size of the lower face of an encapsulating member undergoes a significant volume change during the formation of the encapsulating member. However, with the use of a preliminary encapsulating member, the inventors made it possible to still utilize such a thermoplastic resin that is resistant to degradation by ultraviolet while undergoing a significant volume change during the formation of the encapsulating member.

A semiconductor light emitting device according to the present disclosure has reduced bubbles that can be created due to thermal expansion or contraction during a curing process on the encapsulating member with at least one of its upper or lower face being open.

An encapsulating member in the present disclosure is made of a light-transmitting thermoplastic resin having at least 90% transmissivity for light of a wavelength band ranging from 100 nm to 400 nm. Therefore, the encapsulating member facilitates distribution of the light of a wavelength band ranging from 100 nm to 400 nm, generated from a semiconductor light emitting device chip. This in turn leads to an increased light extraction efficiency.

The encapsulating member is made of a solid light-transmitting thermoplastic resin having at least 90% transmissivity for light of a wavelength band ranging from 100 nm to 400 nm, which is obtained after a liquid-phase light-transmitting thermoplastic resin having at least 90% transmissivity for light of a wavelength band ranging from 100 nm to 400 nm undergoes a reduction in volume by at least 90%.

DESCRIPTION OF REFERENCE NUMERALS/SYMBOLS 1, 8, 9, 700 semiconductor light emitting device
10, 10a, 20, 62, 70, 750 semiconductor light emitting device chip
12, 22, 72, 770 encapsulating member
14, 24, 74 external substrate
145, 243, 745 barrier
144, 244, 744, 844 reflective layer

What is claimed:

1. A method of manufacturing a semiconductor light emitting device comprising: a semiconductor light emitting device chip including a plurality of semiconductor layers, and electrodes electrically connected to the plurality of semiconductor layers, the plurality of semiconductor layers including an active layer adapted to generate light having a wavelength in a band ranging from 200 nm to 280 nm by recombination of electrons and holes; a single encapsulating member of a lens shape for surrounding the semiconductor light emitting device chip; and a single external substrate including a base which has an upper face and a lower face, conductive layers formed on the upper face of the base and electrically connected to the electrodes of the semiconductor light emitting device chip, a barrier located on the upper face of the base and positioned at a predefined distance from the conductive layers and having a top surface, and a reflective layer formed on the upper face of the base and located at a predefined distance from the semiconductor light emitting device chip and from the barrier; wherein the electrodes of the semiconductor light emitting device chip are arranged to face the conductive layers of the single external substrate; wherein the barrier positioned at the predefined distance from the conductive layers has a closed loop shape; wherein a top surface of the closed loop shaped barrier is covered completely or partially with the single encapsulating member of the lens shape surrounding the semiconductor light emitting device chip; wherein the barrier is positioned outside the conductive layers with respect to the semiconductor light emitting device chip and the reflective layer is positioned outside the barrier with respect to the conductive layers; and wherein the barrier is a stopper wall for keeping the encapsulating member from running over the barrier in a configuration where the reflective layer is not covered by the encapsulating member, the method comprising:

placing a solid preliminary encapsulating member over the semiconductor light emitting device chip, wherein the solid preliminary encapsulating member is obtained by curing a liquid-phase light-transmitting thermoplastic resin having at least 80% transmissivity for light of a wavelength band ranging from 200 nm to 280 nm; and thermally curing the solid preliminary encapsulating member to form the single encapsulating member using the barrier as a stopper wall, wherein the reflective layer reflects the light from the semiconductor light emitting device chip and has no electrical connection with the semiconductor light emitting device chip.

2. The method of manufacturing the semiconductor light emitting device according to claim 1, wherein the barrier comprises Au or Al, and the conductive layers comprise Au.

3. The method of manufacturing the semiconductor light emitting device according to claim 1, wherein the liquid-phase light-transmitting thermoplastic resin undergoes a reduction in volume of at least 90% during a curing process.

4. The method of manufacturing the semiconductor light emitting device according to claim 1, wherein thermally curing the solid preliminary encapsulating member to form the single encapsulating member involves forming the single encapsulating member in a way that an outer lateral face of the barrier located between the reflective layer and the barrier is not covered with the single encapsulating member.

* * * * *